United States Patent
Lee et al.

(10) Patent No.: US 12,471,495 B2
(45) Date of Patent: Nov. 11, 2025

(54) COMPOSITION OF PIEZOELECTRIC MATERIAL, METHOD FOR FABRICATING THE SAME, PIEZOELECTRIC DEVICE, AND DISPLAY APPARATUS COMPRISING PIEZOELECTRIC DEVICE

(71) Applicants: LG DISPLAY CO., LTD., Seoul (KR); KOREA UNIVERSITY RESEARCH AND BUSINESS FOUNDATION, Seoul (KR)

(72) Inventors: YongWoo Lee, Paju-si (KR); Chiwan Kim, Paju-si (KR); Yong-Su Ham, Paju-si (KR); YuSeon Kho, Paju-si (KR); Seunghyun Sung, Paju-si (KR); Sahn Nahm, Seoul (KR); Dae-Su Kim, Seoul (KR); Su-Hwan Go, Seoul (KR); Jae-Min Eum, Seoul (KR); Ho-Sung Shin, Seoul (KR)

(73) Assignees: LG DISPLAY CO., LTD., Seoul (KR); KOREA UNIVERSITY RESEARCH AND BUSINESS FOUNDATION, Seoul (KR)

( * ) Notice: Subject to any disclaimer, the term of this patent is extended or adjusted under 35 U.S.C. 154(b) by 994 days.

(21) Appl. No.: 17/559,687

(22) Filed: Dec. 22, 2021

(65) Prior Publication Data
US 2022/0199896 A1   Jun. 23, 2022

(30) Foreign Application Priority Data
Dec. 23, 2020   (KR) .................. 10-2020-0182220

(51) Int. Cl.
*H01L 41/18* (2006.01)
*H10N 30/097* (2023.01)
*H10N 30/87* (2023.01)

(52) U.S. Cl.
CPC .......... *H10N 30/097* (2023.02); *H10N 30/87* (2023.02)

(58) Field of Classification Search
CPC ..................................................... H10N 30/87
(Continued)

(56) References Cited

U.S. PATENT DOCUMENTS

| | | | |
|---|---|---|---|
| 2004/0214723 A1 | 10/2004 | Nonoyama et al. | |
| 2007/0152183 A1* | 7/2007 | Furukawa | H10N 30/8542<br>501/134 |

(Continued)

FOREIGN PATENT DOCUMENTS

| | | |
|---|---|---|
| CN | 112018230 A | 12/2020 |
| JP | 2010-180121 A | 8/2010 |

(Continued)

OTHER PUBLICATIONS

Lee et al., "Pseudocubic-based polymorphic phase boundary structures and thier effect on the piezoelectric properties of (Li, Na, K)(Nb,Sb)O3-SrZrO3 lead-free ceramics," Journal of Alloys and Compounds, vol. 784, 2019, pp. 1334-1343, Available online (Jan. 4, 2019).

*Primary Examiner* — Derek J Rosenau
(74) *Attorney, Agent, or Firm* — Birch, Stewart, Kolasch & Birch, LLP

(57) ABSTRACT

Compositions are disclosed that comprise a piezoelectric material according to Chemical Formula 1: $(1-y)(Na_aK_{1-a})(Nb_{1-x},Sb_x)-ySrZrO_3+n$ mol % CuO, wherein $0.01 \leq y \leq 0.10$, $0.4 \leq a \leq 0.6$, $0 \leq x \leq 0.06$, and $0.5 \leq n \leq 1.5$. The compositions can further comprise a first material, and a second material surrounded by the first material. A piezoelectric device is also described, which includes a piezoelectric device layer including a composition of Chemical Formula 1, and having a first material layer and a second material layer surrounded by the first material layer; a first electrode part disposed on
(Continued)

a first surface of the piezoelectric device layer; and a second electrode part disposed on a second surface facing the first surface.

17 Claims, 21 Drawing Sheets

(58) Field of Classification Search
USPC .................. 310/358; 252/62.9 R, 62.9 PZ
See application file for complete search history.

(56) References Cited

U.S. PATENT DOCUMENTS

| 2019/0288180 | A1* | 9/2019 | Shibata | ............... | H10N 30/704 |
| 2020/0241642 | A1* | 7/2020 | Oh | ........................ | G06F 3/016 |

FOREIGN PATENT DOCUMENTS

| JP | 2013-35746 A | 2/2013 |
| JP | 2020-167360 A | 10/2020 |

* cited by examiner

K, Na, Sr

Nb, Sb, Zr

O

COMPOSITION OF PIEZOELECTRIC MATERIAL, METHOD FOR FABRICATING THE SAME, PIEZOELECTRIC DEVICE, AND DISPLAY APPARATUS COMPRISING PIEZOELECTRIC DEVICE

CROSS-REFERENCE TO RELATED APPLICATIONS

This application claims priority to Korean Patent Application No. 10-2010-0182220 filed on Dec. 23, 2020 in Republic of Korea, the entire contents of which are hereby expressly incorporated by reference into the present application.

BACKGROUND

Technical Field

The present disclosure relates to a composition comprising a piezoelectric material, a method for fabricating the same, a piezoelectric device comprising the piezoelectric composition, and a display apparatus including the piezoelectric device.

Discussion of the Related Art

Piezoelectric materials are widely used as materials for ultrasonic vibrators, electromechanical transducers, and actuator components, and are applicable to a wide range of fields such as ultrasonic apparatuses, imaging apparatuses, sound apparatuses, communication apparatuses, and sensors.

$Pb(Zr,Ti)O_3$ (hereinafter; PZT)-based materials are most commonly used as piezoelectric component materials due to their high piezoelectric properties. However, lead (Pb) is a highly toxic material and is highly volatile in a sintering process, causing serious environmental pollution.

Therefore, it is desired to provide PZT piezoelectric material, which is developed as a lead-free (Pb-free) piezoelectric material to reduce environmental pollution concerns, while providing high piezoelectric properties.

SUMMARY OF THE DISCLOSURE

Accordingly, embodiments of the present disclosure provide a composition of a piezoelectric material, a method for fabricating the same, a piezoelectric device thereof, and a display apparatus comprising a piezoelectric device that substantially obviates one or more problems due to limitations and disadvantages of the related art.

An aspect of the present disclosure provides a composition of a piezoelectric material having high piezoelectric properties without lead.

Another aspect of the present disclosure provides a method for fabricating a composition of a piezoelectric material capable of improving piezoelectric properties by orienting crystals using a template to provide a composition of a piezoelectric material having high piezoelectric properties.

Another aspect of the present disclosure provides a piezoelectric device having high piezoelectric properties and a display apparatus including the same.

Additional features and aspects will be set forth in part in the description that follows, and in part will become apparent from the description, or can be learned by practice of the inventive concepts provided herein. Other features and aspects of the inventive concepts can be realized and attained by the structure particularly pointed out in the written description, or derivable therefrom, and claims hereof as well as the appended drawings.

To achieve these and other aspects of the inventive concepts, as embodied and broadly described herein, a composition of a piezoelectric material comprises $(1-y)(Na_aK_{1-a})(Nb_{1-x},Sb_x)-ySrZrO_3+n$ mol % CuO, wherein $0.01 \leq y \leq 0.10$, $0.4 \leq a \leq 0.6$, $0 \leq x \leq 0.06$, and $0.5 \leq n \leq 1.5$.

In another aspect, a method for fabricating a composition of a piezoelectric material comprises weighing a base material and a seed material; mixing the base material and the seed material to prepare slurry; forming slurry to prepare a molded body; and sintering the molded body to prepare a sintered body, wherein the weighed base material and seed material are expressed by $(1-y)(Na_aK_{1-a})(Nb_{1-x},Sb_x)-ySrZrO_3+n$ mol % CuO, wherein $0.01 \leq y \leq 0.10$, $0.4 \leq a \leq 0.6$, $0 \leq x \leq 0.06$, and $0.5 \leq n \leq 1.5$.

In another aspect, a piezoelectric device comprises a piezoelectric device layer including a first material layer and a second material layer surrounded by the first material layer; a first electrode part disposed on a first surface of the piezoelectric device layer; and a second electrode part disposed on a second surface facing the first surface, wherein the piezoelectric device layer includes a composition of $(1-y)(Na_aK_{1-a})(Nb_{1-x},Sb_x)-ySrZrO_3+n$ mol % CuO, wherein $0.01 \leq y \leq 0.10$, $0.4 \leq a \leq 0.6$, $0 \leq x \leq 0.06$, and $0.5 \leq n \leq 1.5$.

In another aspect, a display apparatus comprises a display panel configured to display an image; and a piezoelectric device including a piezoelectric device layer including a first material layer and a second material layer surrounded by the first material layer, a first electrode part disposed on a first surface of the piezoelectric device layer, and a second electrode part disposed on a second surface facing the first surface.

Other systems, methods, features and advantages will be, or will become, apparent to one with skill in the art upon examination of the following figures and detailed description. It is intended that all such additional systems, methods, features and advantages be included within this description, be within the scope of the present disclosure, and be protected by the following claims. Nothing in this section should be taken as a limitation on those claims. Further aspects and advantages are discussed below in conjunction with embodiments of the disclosure.

It is to be understood that both the foregoing general description and the following detailed description of the present disclosure are exemplary and explanatory and are intended to provide further explanation of the inventive concepts as claimed.

BRIEF DESCRIPTION OF THE DRAWINGS

The accompanying drawings, which are included to provide a further understanding of the disclosure and are incorporated in and constitute a part of this application, illustrate embodiments of the disclosure and together with the description serve to explain principles of the disclosure.

DETAILED DESCRIPTION OF THE EMBODIMENTS

Figure 1:
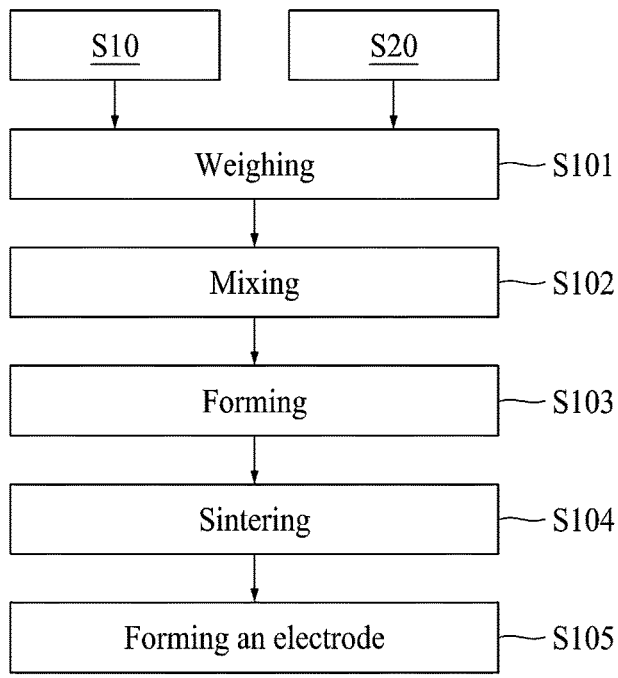
FIG. 1 is a flowchart of a method for fabricating a composition of a piezoelectric material according to an embodiment of the present disclosure.

Reference will now be made in detail to the exemplary embodiments of the present disclosure, examples of which are illustrated in the accompanying drawings. Wherever possible, the same reference numbers will be used throughout the drawings to refer to the same or like parts.

Advantages and features of the present disclosure, and implementation methods thereof will be clarified through following embodiments described with reference to the accompanying drawings. The present disclosure can, however, be embodied in different forms and should not be construed as limited to the embodiments set forth herein. Rather, these embodiments are provided so that this disclosure will be thorough and complete, and will fully convey the scope of the present disclosure to those skilled in the art. Further, the present disclosure is only defined by scopes of claims.

Throughout the drawings and the detailed description, unless otherwise described, the same drawing reference numerals should be understood to refer to the same elements, features, and structures. The relative size and depiction of these elements may be exaggerated for clarity, illustration, and convenience. The progression of processing steps and/or operations described is an example; however, the sequence of steps and/or operations is not limited to that set forth herein and can be changed as is known in the art, with the exception of steps and/or operations necessarily occurring in a particular order. Like reference numerals designate like elements throughout. Names of the respective elements used in the following explanations are selected only for convenience of writing the specification and can be thus different from those used in actual products.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

When "comprise," "have," and "include" described in the present specification are used, another part may be added unless "only" is used. The terms of a singular form may include plural forms unless referred to the contrary.

In construing an element, the element is construed as including an error range or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first", "second", etc. may be used herein to describe various elements, these elements should not be limited by these terms. These terms are only used to distinguish one element from another and may not define order. For example, a first element could be termed a second element, and, similarly, a second element could be termed a first element, without departing from the scope of the present disclosure.

In describing the elements of the present disclosure, the terms "first," "second," "A," "B," "(a)," "(b)," etc., may be used. These terms are intended to identify the corresponding elements from the other elements, and basis, order, or number of the corresponding elements should not limited by these terms.

The expression that an element is "connected," "coupled," or "adhered" to another element or layer the element or layer can not only be directly connected or adhered to another element or layer, but also be indirectly connected or adhered to another element or layer with one or more intervening elements or layers "disposed," or "interposed" between the elements or layers, unless otherwise specified.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

In the description of embodiments, when a structure is described as being positioned "on or above" or "under or below" another structure, this description should be construed as including a case in which the structures contact each other as well as a case in which a third structure is disposed therebetween. The size and thickness of each element shown in the drawings are given merely for the convenience of description, and embodiments of the present disclosure are not limited thereto, unless otherwise specified.

Features of various embodiments of the present disclosure may be partially or overall coupled to or combined with each other, and may be variously inter-operated with each other and driven technically as those skilled in the art may sufficiently understand. The embodiments of the present disclosure may be carried out independently from each other, or may be carried out together in co-dependent relationship.

Hereinafter, embodiments of the present disclosure will be described in detail with reference to the accompanying drawings.

FIG. 1 is a flowchart of a method for fabricating a composition of a piezoelectric material according to an embodiment of the present disclosure.

With reference to FIG. 1, the method for fabricating a composition of a piezoelectric material (or lead-free piezoelectric material) according to an embodiment of the present disclosure includes weighing raw materials of a composition of a piezoelectric material (S101), mixing the weighed raw materials (S102), forming the mixed raw material (S103), sintering the formed composition of a piezoelectric material (S104), and forming an electrode in the sintered composition of a piezoelectric material (S105).

First, the step (S101) of weighing the raw materials of the composition of a piezoelectric material is a step of weighing materials prepared to have a molar ratio of Chemical Formula 1 below through a method (S10) of preparing a base material and a method (S20) of preparing a seed material.

The base material can be prepared to include the following Chemical Formula (1).

[Chemical Formula 1]

Here, $0.01 \leq y \leq 0.10$, $0.4 \leq a \leq 0.6$, $0 \leq x \leq 0.06$, and $0.5 \leq n \leq 1.5$.

Figure 9:
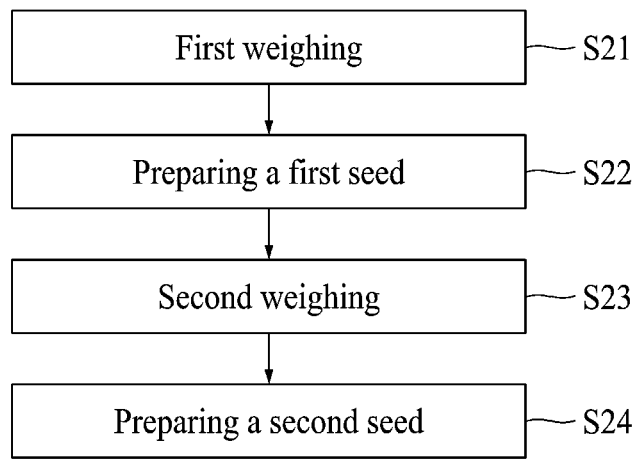
FIG. 9 is a flowchart of a method for fabricating a seed of a composition of a piezoelectric material according to an embodiment of the present disclosure.

For example, the base material includes Chemical Formula 1, and can be prepared by the method (S10) for preparing the base material described later in FIG. 3 and can have a composition in which an equivalent ratio of Na and Nb corresponding to the sodium niobate ($NaNbO_3$) prepared by the step of preparing a seed material described later in FIG. 9 is adjusted.

The seed material has a sodium niobate ($NaNbO_3$) composition and can have a size of 10 μm or more, an aspect ratio of the seed can be in the range of 10 to 20, and the seed material can be prepared by the method (S20) of fabricating a seed described later in FIG. 9.

The seed material can be added in an amount of 1 to 7 mol %, for example, 3 to 7 mol %, based on the composition of a piezoelectric material of the Chemical Formula 1.

Next, the step (S102) of mixing the weighed raw material is a step of mixing the base material and the seed material weighed in the previous step.

The step of mixing the weighed raw materials can include a step of preparing a slurry including the base material and mixing the seed material into the slurry including the base material.

For example, in the step of preparing a slurry including the base material, an appropriate amount of a dispersant and a solvent can be added to the base material having the composition of the Chemical Formula 1. For example, the solvent can include at least one or more of ethanol, methanol, isopropanol, methyl ethyl ketone (MEK), toluene, and distilled water, but embodiments of the present disclosure are not limited thereto. By adding an appropriate amount of dispersant and solvent to the base material, the slurry in which the base material is properly dispersed in the solvent can be prepared. According to an embodiment of the present disclosure, a dispersant can be used to reduce the viscosity of the slurry including the base material.

In addition, ball milling can be performed by further adding an appropriate amount of a binder and a plasticizer to the previously prepared slurry of the base material slurry. The binder can provide strength, flexibility, ductility, durability, toughness, and softness of the molded body (or molded green body or green sheet). As the binder, a material known in the field of piezoelectric material composition can be used. A plasticizer can be added to provide elastic and plastic properties of forming the molded body, and a material known in the field of piezoelectric material composition can be used as the plasticizer.

The step of mixing the seed material with the base material is a step of mixing the seed material with the slurry including the base material prepared in the previous step, which can be performed by a stirring process and can be performed by inserting a magnetic bar into a beaker and at a low speed (40 rpm) for a relatively shorter time than other mixing steps.

In addition, the method can further include a de-gassing step and an aging step of removing bubbles and gases after the seed material is added and mixed to the slurry including the base material.

The de-gassing step is a step for adjusting the viscosity of the slurry to an appropriate viscosity for a forming or molding process in the step of forming or molded the piezoelectric material to be described later. For example, the de-gassing step can be adjusted to have a viscosity of 1700 to 2400 cps (centipoise) using a stirrer at room temperature.

The aging step is a step for adjusting a temperature to room temperature again because the slurry can be cooled when the solvent is volatilized in the previous de-gassing step. For example, in the aging step, stirring can be performed for a short time at a low speed of about 40 rpm using a stirrer.

Next, the step of forming or molding the piezoelectric material (S103) is a step of forming a molded body having a certain volume and shape with the slurry prepared in the previous step (S102) in which the base material and the seed material are mixed.

For example, forming or molding the piezoelectric material can include tape casting, a first forming or molding the tape-cast piezoelectric material, and a second forming or molding the first formed or molded piezoelectric material.

The step of tape casting is a step of tape casting the slurry prepared in the previous step in which the base material and the seed material are mixed using a tape casting apparatus. In the case of tape casing with a slurry having viscosity of 1700 to 2400 cps, it can be cast with a thickness of about 30 µm.

The step of first forming or first molding the tape-cast piezoelectric material can be performed by the warm isostatic press (WIP), and the step of second forming or second molding the tape-cast piezoelectric material can be performed by cold isostatic press (CIP), which can be used for increasing density of a sintered body in a sintering step to be described later. In addition, in the case of a composition of a piezoelectric material according to an embodiment of the present disclosure, warm isotropic forming or molding can be performed when a molded body is prepared based on stacking and lamination such as tape casting.

In addition, the step (S103) of forming or molding the piezoelectric material can further include a degreasing step after the primary forming (or first forming or first molding) step, and the degreasing step is a step of removing a solvent or an organic material. The degreasing step can be maintained in a furnace in a temperature range of 300 to 600° C. for about 10 hours and then furnace-cooled to room temperature.

Next, the step of sintering the molded body (S104) will be described.

The sintering can be performed as a sintering method performed in two temperature sections. After a first sintering temperature can be adjusted to a first temperature, when the temperature is reached, cooling can be performed at a second temperature lower than the first temperature and then maintained for a predetermined period of time. For example, the first temperature can be 1160° C. and the second temperature can be 1000 to 1070° C. For example, a time at the second temperature can be maintained 6 hours.

Next, the step (S105) of forming an electrode on the sintered body will be described.

Electrodes can be formed on a first surface of the piezoelectric material sintered body prepared in the previous step and a second surface opposite to the first surface. For example, the electrode can be formed by applying silver (Ag), but embodiments of the present disclosure are not limited thereto, and any known general electrode can be used without limitation.

Figure 2A:
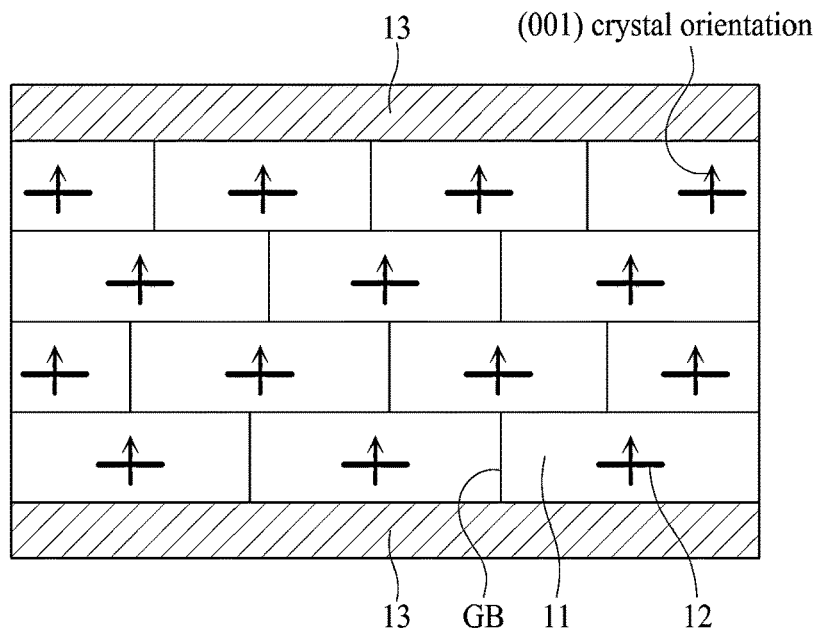
FIG. 2A is a cross-sectional view showing a piezoelectric device according to an embodiment of the present disclosure.
Figure 2B:
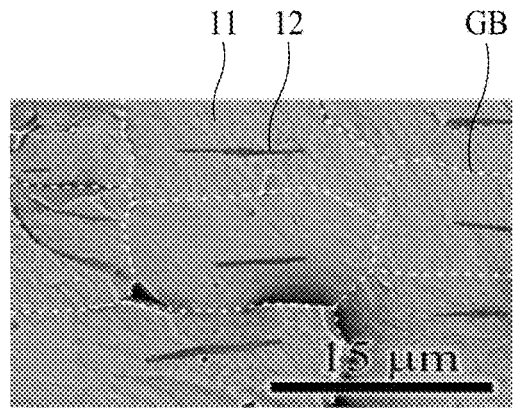
FIG. 2B is a scanning electron microscope photograph of a composition of a piezoelectric material according to an embodiment of the present disclosure.

FIG. 2A is a cross-sectional view showing a piezoelectric material according to an embodiment of the present disclosure, FIG. 2B is a scanning electron microscope photograph of a piezoelectric material according to an embodiment of the present disclosure.

With reference to FIG. 2A, a piezoelectric material 10 according to an embodiment of the present disclosure can include a plurality of grains including a first material 11 and a second material 12, and the grains including the first material 11 and the second material 12 can be classified by grain boundaries (GB).

The second material 12 can be formed in the inner portion or inside the first material 11, and the first material 11 is grown based on a crystal orientation (or crystallographic direction) of the second material 12, so that a plurality of first materials 11 can have the same crystal orientation. For example, the first material 11 can have a (001) crystal orientation. Accordingly, in an embodiment, the first material 11 can be disposed to surround the second material 12.

The second material 12 can be disposed in a central portion of the first material 11. Here, in the first material 11 having a predetermined volume, the central portion is not exactly half numerically but can be a predetermined area including the center of the first material 11 having a predetermined volume, and thus, even if the second material 12 is disposed at a position out of the center of the first material 11, it can be included in an embodiment of the present disclosure. For example, the second material 12 can be disposed in the first material 11 and can be biased to be adjacent to the grain boundary GB, which is a boundary between the plurality of first materials 11 in the crystal orientation growth.

In addition, the piezoelectric material 10 can further include an electrode part 13 formed at each of a first surface of a sintered body of the first material 11 and the second material 12 formed to have a predetermined thickness and a second surface facing the first surface. When the piezoelectric material 10 further includes the electrode part 13, it can function as a piezoelectric device.

The first material 11 can be a base material. The first material 11 can be prepared by a method (S10) of preparing a base material, which will be described later.

The second material 12 can be a seed material. The second material 12 can be prepared by a method (e.g., S20 in FIG. 9) of preparing a seed material, which will be described later.

In the sintering step (S104) of the method (S100) of fabricating a composition of a piezoelectric material according to an embodiment of the present disclosure, the first material 11 can act as a template to allow the second material 12 to grow in a crystal direction of the second material 12. For example, the first material 11 can be sintered depending on the crystal direction of the second material 12 and grown so that a crystal direction thereof is oriented in the same direction.

With reference to FIG. 2B, it can be seen that the first material 11 is properly oriented in a (001) direction with a piezoelectric material without second phase.

Here, the first material 11 is template grain grown based on the second material 12 so that the crystal orientation of the first material 11 can be aligned in one direction like a single crystal. For example, the crystal orientation of the first material 11 can be aligned in the (001) direction, and the crystal orientation of the piezoelectric material 10 including the first material 11 and the second material 12 can be aligned in one direction like a single crystal, so that piezoelectric properties can be maximized.

Figure 3:
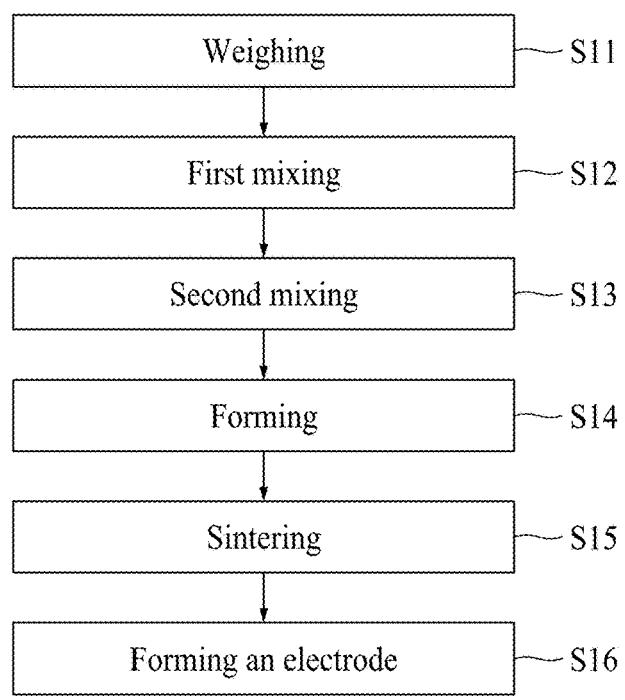
FIG. 3 is a flowchart of a method for fabricating a base material of a composition of a piezoelectric material according to an embodiment of the present disclosure.

FIG. 3 is a flowchart of a method for fabricating a base material of a composition of a piezoelectric material according to an embodiment of the present disclosure.

With reference to FIG. 3, the method for fabricating a base material of a composition of a piezoelectric material according to an embodiment of the present disclosure includes weighing a base material (S11), first mixing the base material (S12), second mixing the first mixed material (S13), forming or molding the second mixed material (S14), a sintering a molded body of a base material (S15), and forming an electrode on the base material sintered body (S16).

For example, the base material prepared for use in the step (S101) of weighing a raw material of a composition of a piezoelectric material of FIG. 1 can be applied by omitting steps of forming or molding, sintering, and electrode formation, after the step (S13) of second mixing the first mixed material.

First, in the method for fabricating the base material of the composition of a piezoelectric material according to an embodiment of the present disclosure, the step of weighing the base material (S11) can be a step of weighing the base material according to a molar ratio and adding an appropriate amount of solvent.

Here, the molar ratio of the composition can be a molar ratio excluding copper oxide (CuO) in the Chemical Formula 1.

For example, in the step of weighing the base material, sodium carbonate ($Na_2CO_3$), potassium carbonate ($K_2CO_3$), niobium oxide ($Nb_2O_5$), antimony oxide ($Sb_2O_5$), strontium carbonate ($SrCO_3$), and/or zirconium oxide ($ZrO_2$) can be weighed according to the molar ratio of the composition to be synthesized, put into a nylon jar, and an appropriate amount of solvent (for example, ethanol) can be added thereto.

Next, the step of first mixing the base material (S12) is a step of mixing and pulverizing the weighed base material and ethanol using a ball milling process for 24 hours. In addition, the first mixing step can further include a drying step for separating powder mixed with the solvent after the first mixing step. Here, the drying step can be performed by putting the first mixed base material in a dish and drying it sufficiently at a temperature of 100° C.

In addition, according to an embodiment of the present disclosure, the step of first mixing the base material (S12) can further include a step of phase-synthesizing the first mixed material.

The step of phase-synthesizing can include a step of grinding the dried mixture with a mortar after the first mixing is completed, putting the mixture in an alumina crucible, raising a temperature in an electric furnace at a heating rate of 5° C./min, calcining at 850° C. for 3 hours, and then naturally cooling to room temperature.

Next, in the step (S13) of second mixing of the first mixed material, 1 mol % of copper oxide (CuO) is mixed in the first mixture, a solvent (ethanol) is added together, and mixed and pulverized for 72 hours using a ball milling process.

In addition, the second mixing step can further include a drying step to separate powder mixed with the solvent after the second mixing step. Here, the drying step can be performed by putting the second mixed base material in a dish and drying it sufficiently at a temperature of 100° C. For example, the drying step can be performed for 3 hours.

In addition, according to an embodiment of the present disclosure, the step (S13) of second mixing of the first mixed material can further include a step of sieving the second mixed material.

The sieving step is a step of making a powder including particles of a certain size or less by filtering dried powder finely ground in a mortar using a sieve of 40 mesh. The powder passed through a 40 mesh sieve can have a size of 400 μm or less.

Next, the step (S14) of forming or molding the second mixed material can be a step of press-forming or press-molding the sieved powder.

For example, the step of forming or molding the second mixed material can be a step of putting into a circular-shaped forming mold and uniaxially press-forming or press-molding, and a pressure of uniaxially press-forming or press-molding can be 100 kg/f, but is limited thereto.

Next, the step of sintering the molded body of the base material (S15) can be a step of sintering at a set sintering temperature.

For example, the sintering temperature can be performed in the range of 1050° C. to 1070° C., and a sintering time can be maintained for 6 hours.

Next, the step of forming an electrode on the base material sintered body (S16) can be a step of applying the electrode to one surface and the other surface facing the one surface of the sintered body.

For example, the electrode applied to the sintered body can be a silver (Ag) electrode, but embodiments of the present disclosure are not limited thereto.

In addition, the method can further include a step of poling the sintered body to which the electrode is applied after applying the electrode, and, in the step of poling, for example, polarization can be aligned by applying an electric field of 4 kV/mm for about 30 minutes in silicone oil set at a temperature of 65° C.

Figure 4:
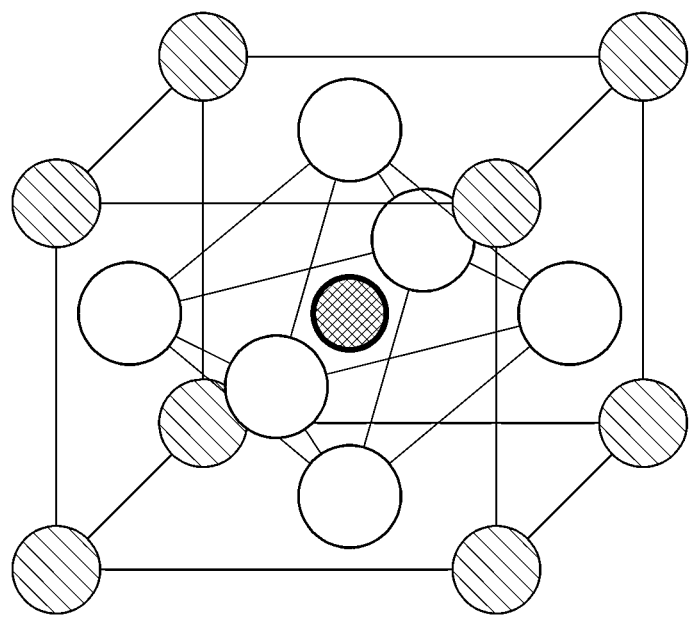
FIG. 4 illustrates a crystal structure of a composition of a piezoelectric material according to an embodiment of the present disclosure.
Figure 4:
Figure 4:
Figure 4:
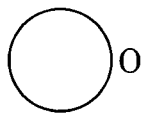

FIG. 4 illustrates a crystal structure of a piezoelectric material according to an embodiment of the present disclosure.

With reference to FIG. 4, a piezoelectric material having the composition of Chemical Formula 1 of the present disclosure can have a structure of $ABX_3$. Here, A is a first cation, B is a second cation, and X is an anion bonded thereto. The first cation can be potassium (K), sodium (Na), or strontium (Sr), the second cation can be niobium (Nb), antimony (Sb), and zirconium (Zr), and the anion is oxygen (O). The first cation and the anion form a cubic octahedral structure of $AX_{12}$, and the second cation is a structure combined to $BX_6$ in an octahedral structure.

Figure 5A:
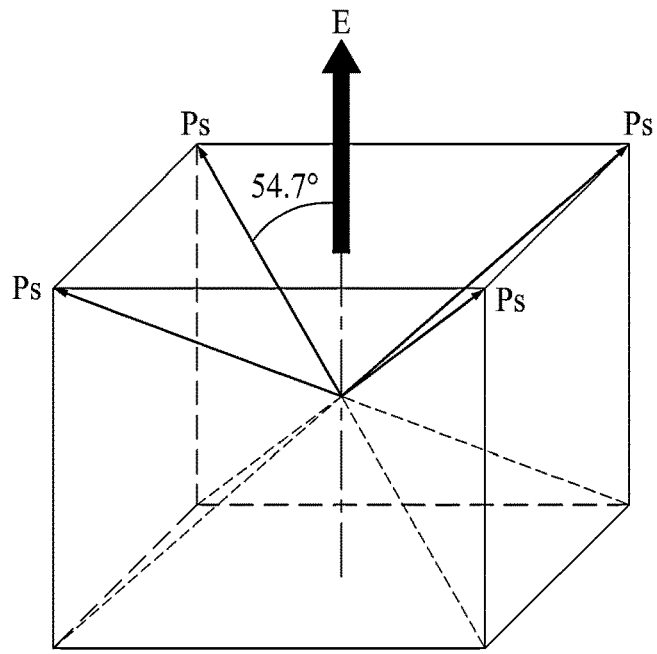
FIG. 5A illustrates an orthorhombic polar direction of a composition of a piezoelectric material according to an embodiment of the present disclosure.
Figure 5B:
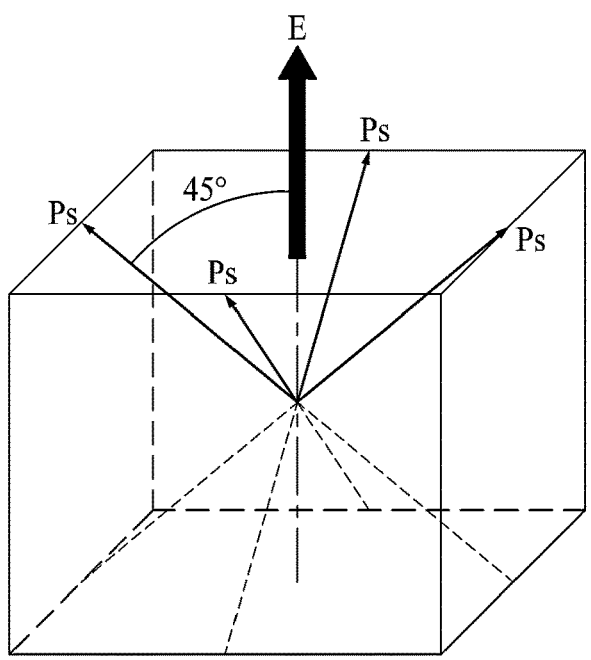
FIG. 5B illustrates a rhombohedral polar direction of a composition of a piezoelectric material according to an embodiment of the present disclosure.

FIG. 5A illustrates an orthorhombic polar direction of a piezoelectric material according to an embodiment of the present disclosure, and FIG. 5B illustrates a rhombohedral polar direction of a piezoelectric material according to an embodiment of the present disclosure.

Referring to FIGS. 5A and 5B, when a piezoelectric material having the composition of Chemical Formula 1 has an orthorhombic structure, when a high electric field is applied in the [001] direction, the direction of the applied electric field (E) and the four polar directions can each have an angle of 54.7°, and when the piezoelectric material having the composition of Chemical Formula 1 has a rhombohedral structure, when a high electric field is applied in the [001] direction, the direction of the applied electric field (E) and the four polar directions can each have an angle of 45°. In addition, a tetragonal structure can have one direction in which the direction of the applied electric field E and the polar direction are the same.

Piezoelectric performance of the piezoelectric material oriented in the (001) direction can be higher as the number of crystallographic orientations with respect to the crystal growth direction increases. Therefore, the presence of a tetragonal structure can degrade the performance of a piezoelectric material oriented in the (001) direction, so preparing a material with a crystal structure in which orthorhombic and rhombohedral co-exists can further improve the piezoelectric properties.

Figure 6:
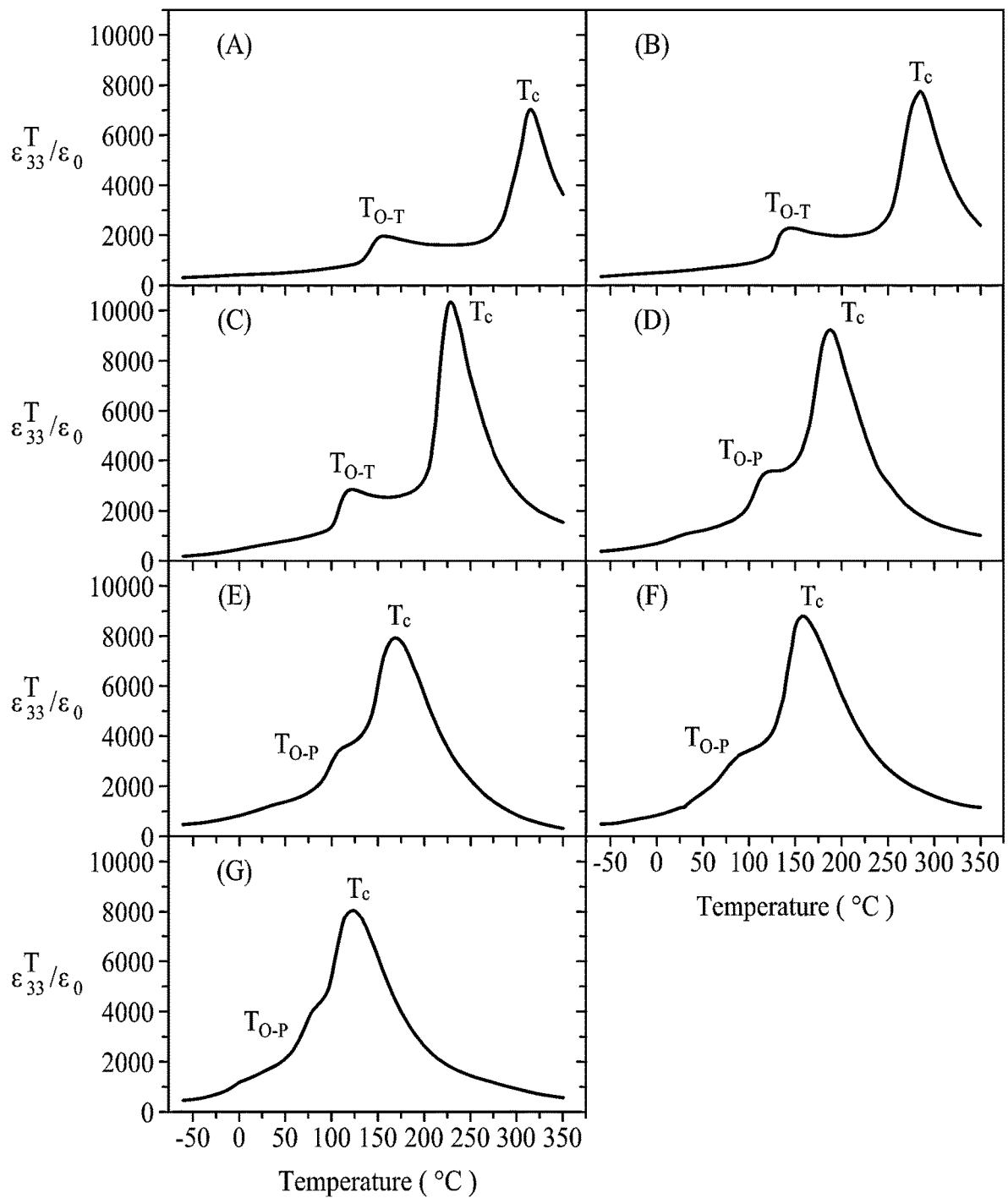
FIG. 6 illustrates graphs showing a change in a dielectric constant value according to an antimony (Sb) content and temperature of a base material of a composition of a piezoelectric material according to an embodiment of the present disclosure.

FIG. 6 is a graph showing a change in a dielectric constant value according to the antimony (Sb) content and temperature of the base material of the composition of a piezoelectric material according to an embodiment of the present disclosure.

Particularly, FIG. 6(A) is a graph showing a phase transition temperature when a value of x is 0 in the composition of the base powder of Chemical Formula 1. FIG. 6(B) is a graph showing a phase transition temperature when the value of x is 0.01 in the composition of the base powder of Chemical Formula 1. FIG. 6(C) is a graph showing a phase transition temperature when the value of x is 0.03 in the composition of the base powder of Chemical Formula 1. FIG. 6(D) is a graph showing a phase transition temperature when the value of x is 0.04 in the composition of the base powder of Chemical Formula 1. FIG. 6(E) is a graph showing a phase transition temperature when the value of x is 0.05 in the composition of the base powder of Chemical Formula 1. FIG. 6(F) is a graph showing a phase transition temperature when the value of x is 0.055 in the composition of the base powder of Chemical Formula 1. FIG. 6(G) is a graph showing a phase transition temperature when the value of x is 0.06 in the composition of the base powder of Chemical Formula 1.

With reference to the graph of FIG. 6(A), it can be seen that, when antimony (Sb) is not added, the transition temperature Tc is about 310° C. and a temperature at which a crystal structure of the base material is changed from the orthorhombic (O) structure to a tetragonal (T) structure is about 150° C.

Next, with reference to the graph of FIG. 6(B), it can be seen that, when the value of x is 0.01 in the composition of the base powder of Chemical Formula 1, the transition temperature Tc is about 280° C. and a temperature at which a crystal structure of the base material is changed from the orthorhombic (O) structure to a tetragonal (T) structure is about 140° C.

Next, with reference to the graph of FIG. 6(C), it can be seen that, when the value of x is 0.03 in the composition of the base powder of Chemical Formula 1, the transition temperature Tc is about 230° C. and a temperature at which a crystal structure of the base material is changed from the orthorhombic (O) structure to a tetragonal (T) structure is about 120° C.

Next, with reference to the graph of FIG. 6(D), it can be seen that, when the value of x is 0.04 in the composition of the base powder of Chemical Formula 1, the transition temperature Tc is about 180° C. and a temperature at which a crystal structure of the base material is changed from the orthorhombic (O) structure to a pseudocubic (P) structure is about 115° C.

Next, with reference to the graph of FIG. 6(E), it can be seen that, when the value of x is 0.05 in the composition of the base powder of Chemical Formula 1, the transition temperature Tc is about 170° C. and a temperature at which a crystal structure of the base material is changed from the orthorhombic (O) structure to a pseudocubic (P) structure is about 110° C.

Next, with reference to the graph of FIG. 6(F), it can be seen that, when the value of x is 0.055 in the composition of the base powder of Chemical Formula 1, the transition temperature Tc is about 160° C. and a temperature at which a crystal structure of the base material is changed from the orthorhombic (O) structure to a pseudocubic (P) structure is about 90° C.

Next, with reference to the graph of FIG. 6(G), it can be seen that, when the value of x is 0.06 in the composition of the base powder of Chemical Formula 1, the transition temperature Tc is about 125° C. and a temperature at which a crystal structure of the base material is changed from the orthorhombic (O) structure to a pseudocubic (P) structure is about 60° C.

With reference to the change in the crystal structure according to the antimony composition in FIG. 6, it can be seen that, as the amount of antimony increases in the piezoelectric material composition of Chemical Formula 1, antimony (Sb) is dissolved in the position of niobium (Nb), and accordingly, the transition temperature, the transition temperature ($T_{O-T}$) of the tetragonal (T) structure in the orthorhombic structure, and the transition temperature ($T_{O-P}$) of the pseudocubic (P) structure in the orthorhombic structure are lowered.

For example, when the value of x in the composition of the base powder of Chemical Formula 1 is solid solution of 0.04 or more, the orthorhombic structure is not changed to the tetragonal structure and the orthorhombic structure is changed to a pseudocubic structure in which the tetragonal structure is similar to a cubic structure.

Accordingly, the base material of the piezoelectric material composition can have an orthorhombic structure at room temperature when the value of x in Chemical Formula 1 is 0.03 or less, and can have a structure in which orthorhombic and pseudocubic crystals coexist at room temperature when the value of x is 0.04 or more.

Figure 7:
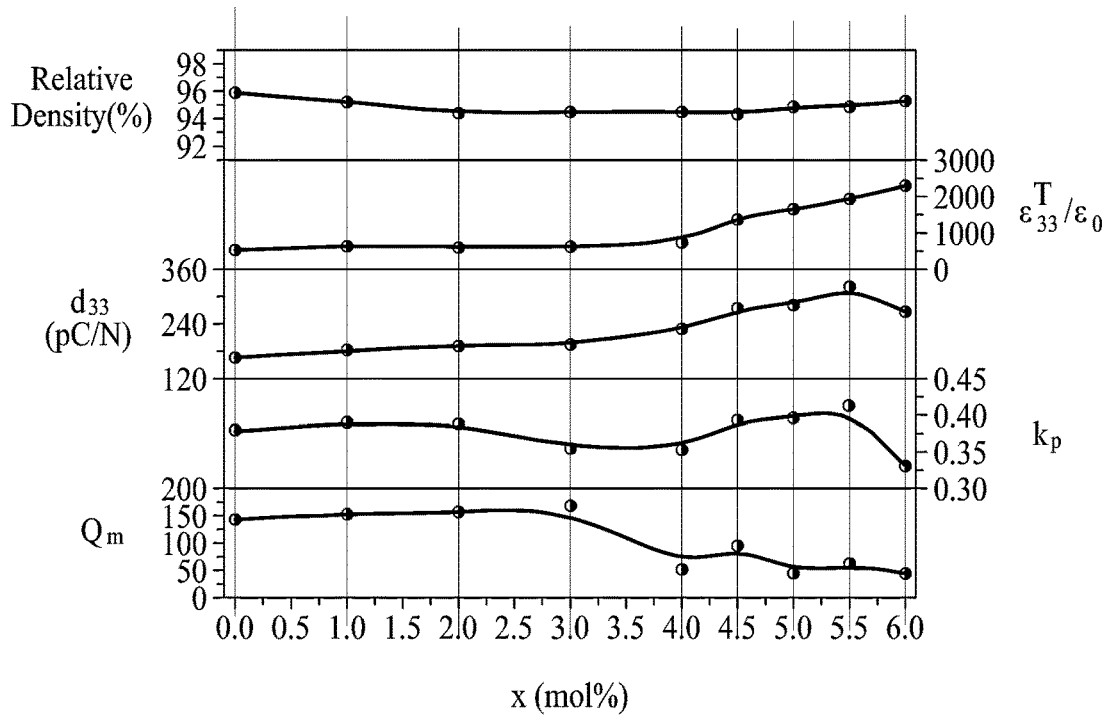
FIG. 7 illustrates relative density, dielectric constant ($\varepsilon^T_{33}/\varepsilon_0$), piezoelectric charge constant (or piezoelectric constant) ($d_{33}$), electromechanical coupling factor (kρ), and mechanical quality factor (Qm) according to a change in antimony (Sb) content of a base material of a piezoelectric material according to an embodiment of the present disclosure.

FIG. 7 illustrates relative density, dielectric constant ($\varepsilon^T_{33}/\varepsilon_0$), piezoelectric charge constant ($d_{33}$), electromechanical coupling factor (kρ), and mechanical quality factor (Qm) according to a change in antimony (Sb) content of a base material of a piezoelectric material according to an embodiment of the present disclosure.

With reference to FIG. 7, it can be seen that a relative density has a value in the range of 94 to 96% according to the content of antimony (Sb), whereby it can be seen that it has a high relative density exceeding 94%, a theoretical density under all conditions regardless of the content of antimony (Sb).

It can be seen that the dielectric constant ($\varepsilon\varepsilon^T_{33}/\varepsilon_0$) increases as the content of antimony (Sb) increases. For example, when antimony (Sb) is not added, the dielectric constant value is about 516, and it can be seen that the dielectric constant value significantly increases when the value of x exceeds 0.04. The increase in dielectric constant can be explained by a structure in which orthorhombic and pseudocubic crystals coexist at room temperature, as illustrated in FIG. 6.

The piezoelectric charge constant ($d_{33}$) shows a low value of about 165 pC/N when the value of x is 0, and increases significantly in a section where the value of x is 0.03 or more, has a maximum value of about 325 pC/N at 0.055 of the x value, and decreases at a value of 0.06 of the x value. The increase in the piezoelectric charge constant in the section where the value of x is 0.03 or more can be explained by the structure in which orthorhombic and pseudocubic structures coexist at room temperature as shown in FIG. 6, and when the piezoelectric charge constant is again decreased at 0.06 of the x value can be an increase in the proportion of the pseudocubic structure.

Electromechanical coupling factor (kρ) can be a coefficient indicating a large correlation with efficiency when the composition of a piezoelectric material according to an embodiment of the present disclosure is applied as an actuator or an exciter. For example, it can be seen that the electromechanical coupling factor (kρ) shows a similar value regardless of the value of x, and has a maximum value when the value of x is 0.055.

Mechanical quality factor (Qm) decreases as the content of antimony (Sb) increases, and, for example, it can be seen that the mechanical quality factor is significantly decreased when the value of x is 0.04. The decrease in the mechanical quality factor can be explained by the structure in which orthorhombic and pseudocubic structures coexist at room temperature as shown in FIG. 6 above.

Therefore, it can be seen that the piezoelectric properties are improved by the coexistence of orthorhombic and pseudocubic structures, when with reference to the result of relative density, dielectric constant ($\varepsilon^T_{33}/\varepsilon_0$), piezoelectric charge constant ($d_{33}$), electromechanical coupling factor, and mechanical quality factor (Qm) according to the change in the antimony (Sb) content of the base material of the composition of a piezoelectric material.

Figure 8:
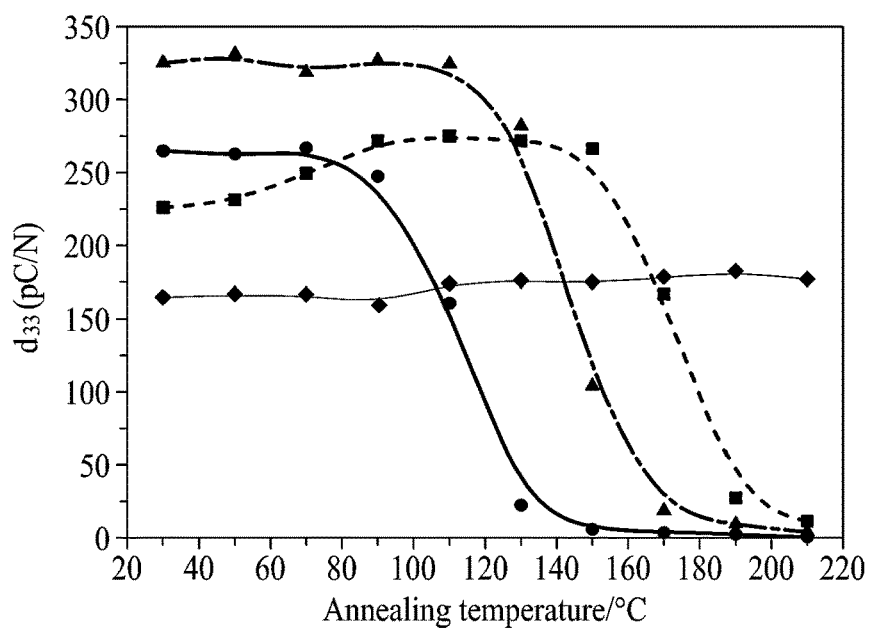
FIG. 8 is a graph showing a change in an antimony (Sb) content and piezoelectric properties according to temperature of a base material of a composition of a piezoelectric material according to an embodiment of the present disclosure.

FIG. 8 is a graph showing the change in the antimony (Sb) content of the base material of the composition of a piezoelectric material according to an embodiment of the present disclosure and the piezoelectric properties according to temperature. In FIG. 8, the piezoelectric charge constant changed when a temperature was increased from room temperature to about 200° C., while adjusting antimony (sb) was adjusted to 0, 4, 5.5, and 6 mol % in the base material composition of the piezoelectric material composition expressed by Chemical Formula 1.

In FIG. 8, the thin solid line indicates antimony (Sb) of 0 mol %, the dotted line indicates antimony (Sb) of 4 mol %, the dashed-dotted line indicates antimony (Sb) of 5.5 mol %, and the thick solid line indicates antimony (Sb) of 6 mol %.

With reference to FIG. 8, it can be seen that, when antimony is not added in the base material composition of the composition of a piezoelectric material, the piezoelectric charge constant shows a low value of about 160 pC/N, but there is no significant change at room temperature to about 200° C.

Next, when 4 mol % of antimony is added in the base material composition of the composition of a piezoelectric material, the piezoelectric charge constant shows a value of about 225 pC/N at room temperature, gradually increases up to 130° C., and is significantly decreased when the temperature exceeds 150° C.

Next, when 5.5 mol % of antimony is added in the base material composition of the composition of a piezoelectric material, the piezoelectric charge constant shows a value of about 325 pC/N at room temperature, is maintained up to 110° C., and is significantly decreased in a section in which the temperature exceeds 130° C.

Next, when 6 mol % of antimony is added in the base material composition of the composition of a piezoelectric material, the piezoelectric charge constant shows a value of about 260 pC/N at room temperature, is maintained up to 70° C., and is significantly decreased in a section in which the temperature exceeds 90° C.

Therefore, with reference to FIG. 8, it can be seen that, when 5.5 mol % of antimony (Sb) is added in the base material composition of the composition of a piezoelectric material, it has the highest piezoelectric charge constant value (or piezoelectric constant value), and the piezoelectric properties are maintained up to a temperature range of about 110 to 120° C.

FIG. 9 is a flowchart of a method for fabricating a seed of a composition of a piezoelectric material according to an embodiment of the present disclosure.

With reference to FIG. 9, the method (S20) for preparing a seed of a composition of a piezoelectric material according to an embodiment of the present disclosure includes a step of first weighing a seed material (S21), a step of preparing a first seed (S22), a step of second weighing (S23), and a step of preparing a second seed (S24).

First, the step of first weighing the seed material (S21) is a step of weighing a first seed material according to a molar ratio and applying an appropriate amount of solvent.

Here, the molar ratio of the composition to be synthesized in the first seed can be $(Bi_{2.5}Na_{3.5})Nb_5O_{18}$. Therefore, hereinafter, the first seed can be referred to as a "BNN seed".

For example, in the step of first weighing the seed material, sodium carbonate ($Na_2CO_3$), niobium oxide ($Nb_2O_5$), bismuth oxide ($Bi_2O_3$) and sodium chloride (NaCl) can be weighed according to the molar ratio of the composition to be synthesized into a nylon jar, and an appropriate amount of solvent can be added. For example, the solvent can be ethanol, but embodiments of the present disclosure are not limited thereto.

In addition, the ratio of niobium oxide ($Nb_2O_5$) and bismuth oxide ($Bi_2O_3$) and sodium chloride (NaCl) in the first weighing step can be adjusted. For example, a ratio of an oxide including niobium oxide ($Nb_2O_5$) and bismuth oxide ($Bi_2O_3$) to sodium chloride can be 1:1.5, but embodiments of the present disclosure are not limited thereto.

The step of preparing the first seed (S22) can further include a step of mixing the material weighed in the previous step and a step of phase-synthesizing the mixed first seed material.

For example, the mixed first seed material can be mixed with a solvent and mixed and pulverized for 12 hours using a ball milling process. In addition, the step of mixing the first seed can further include a step of drying to separate powder mixed with the solvent after the mixing and pulverizing step is completed. Here, the drying step can be performed by putting the first mixed base material in a dish and drying it sufficiently at a temperature of 100° C.

For example, in the step of phase-synthesizing, the first seed material can be mixed and dried, then the mixture is finely ground with a mortar, put in an alumina crucible, and heated at a heating rate of 5° C./min in an electric furnace, calcined at 1100 to 1175° C. for 6 hours, and then naturally cooled to room temperature. As will be described later in FIG. 11, the calcined BNN seed can have a predetermined plate-shaped particle. Here, the step of phase-synthesizing the first seed material can be referred to as primary calcination.

The step of preparing the first seed (S22) can further include washing the calcined first seed.

For example, in the step of washing the first seed, the first seed can be washed 5 to 10 times using water at 80° C. or higher and then filtered to remove sodium chloride (NaCl) adhered to the first seed powder.

Next, in the second weighing step (S23), a material including first seed powder and sodium for replacing bismuth (Bi) of the first seed powder and an appropriate amount of a solvent can be added to match the molar ratio of the composition and weighed.

Here, the molar ratio of the composition of the second seed can be sodium niobate ($NaNbO_3$). Therefore, hereinafter, the second seed can be referred to as an "NN seed".

For example, in the second weighing step, sodium carbonate ($Na_2CO_3$) and sodium chloride (NaCl) can be weighed according to a molar ratio of a composition to be synthesized and put into a beaker, and an appropriate amount of solvent can be added thereto. For example, the solvent can be ethanol, but embodiments of the present disclosure are not limited thereto.

Next, the step of preparing the second seed (S24) can include mixing the second weighed material and performing a topochemical reaction.

For example, the step of mixing the secondly weighed material can be performed by a stirring process and can be performed at 80 rpm for 6 hours after applying a magnetic bar into a beaker.

In addition, the step of preparing the second seed can further include a drying step for drying the mixed second weighed material. Here, the drying step can be performed by putting the mixture into a dish and drying at a temperature of 100° C. for 3 hours.

For example, performing the topochemical reaction can be performed at 975° C. for 6 hours by placing the dried second seed material in a crucible. By performing the topochemical reaction, bismuth (Bi) included in the first seed can be exchanged for sodium (Na). The topochemical reaction will be described later in detail with reference to FIG. 10.

Here, the step of performing the topochemical reaction can be referred to as second calcination.

The step of preparing the second seed (S24) can further include washing the second seed on which the topochemical reaction was completed.

For example, in the step of washing the second seed, the second seed can be washed using water at 80° C. or higher for 5 to 10 times and filtered to remove sodium chloride (NaCl) adhered to the NN seed.

In addition, even after washing and filtering, to remove the bismuth (Bi) remaining in the NN seed, the seed can be acidified several times using nitric acid, followed by neutralization washing with water. For example, after pouring nitric acid into the beaker, put the NN seed, and shaken every 10 minutes, which can be repeatedly performed for 1 hour to 2 hours.

Figure 10:
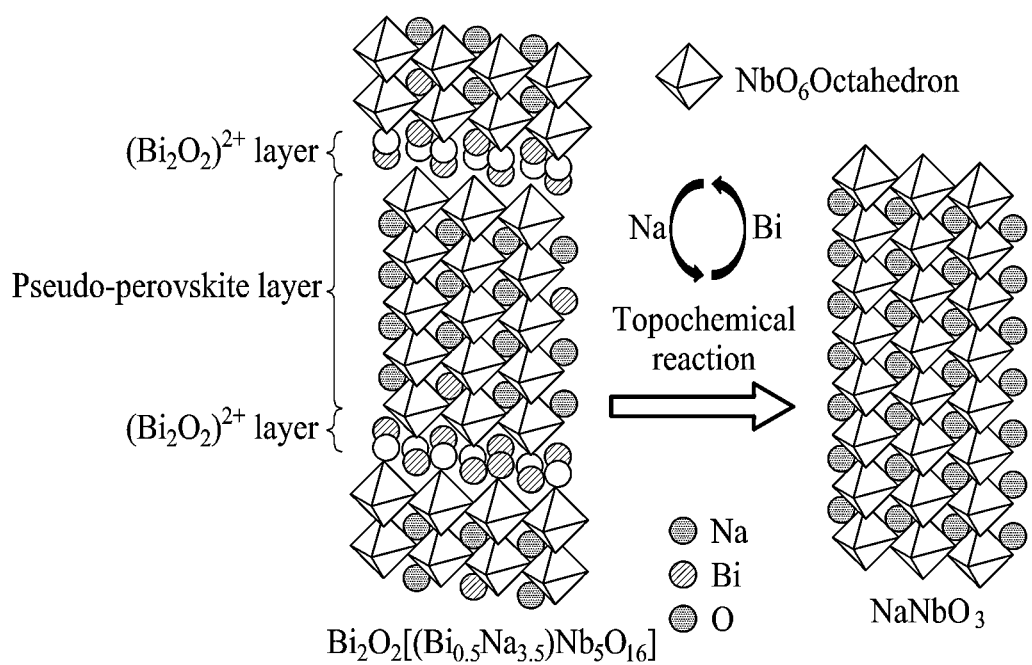
FIG. 10 illustrates a crystal change occurring in preparing a second seed.

FIG. 10 illustrates a crystal change occurring in the step of preparing the second seed. The crystal structure having a composition of $Bi_2O_2[(Bi_{0.5}Na_{3.5})Nb_5O_{16}]$ shown on the left in FIG. 10 is a first seed, which can be referred to as a BNN seed hereinafter. The crystal structure having the sodium niobate ($NaNbO_3$) composition shown on the right shows a second seed, which can be referred to as an NN seed hereinafter.

With reference to FIG. 10, a crystal structure of the first seed having the composition of $Bi_2O_2[(Bi_{0.5}Na_{0.5})Nb_5O_{16}]$ can have a structure in which a layer in which sodium (Na) and bismuth (Bi) coexist between the $NbO_6$ octahedrons, a $(Bi_2O_2)^{2+}$ layer, pseudo-perovskite layer, $(Bi_2O_2)^{2+}$ layer, and a layer in which sodium (Na) and bismuth (Bi) coexist between $NbO_6$ octahedrons are repeated from above. Next, a crystal structure of the second seed having the sodium niobate ($NaNbO_3$) composition can have a structure in which sodium (Na) surrounds the $NbO_6$ octahedron at the center.

By the step (S24) of preparing the second seed of FIG. 9, the first seed can be converted into a second seed by a topochemical reaction. Here, topochemical refers to a chemical reaction in which the orientation of the mother crystal and the crystal orientation of a product material have different orientation relationships in the solid-state chemical reaction, while a shape of the crystal grains is preserved.

Therefore, as shown in FIG. 10, in the process in which the bismuth (Bi) element of the first seed is replaced with the sodium (Na) element, the layer in which sodium (Na) and bismuth (Bi) coexist between the $NbO_6$ octahedrons ($Bi_2O_2$) $^{2+}$ layer, and the pseudo-perovskite layer can all be converted into a single structure with the sodium niobate ($NaNbO_3$) composition.

Figure 11:
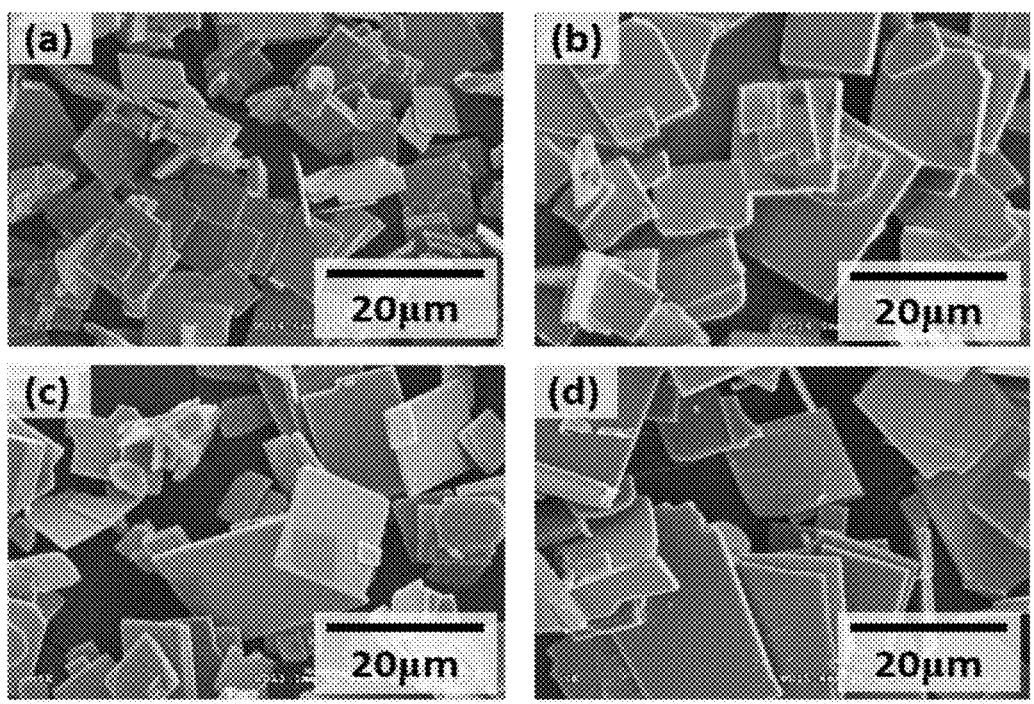
FIG. 11 is a scanning electron microscope photograph of a first seed prepared by changing a phase synthesis temperature condition in preparing the first seed of FIG. 9.

FIG. 11 is a photograph of the first seed prepared by changing the phase synthesis temperature condition in the step of preparing the first seed of FIG. 9, taken by a scanning electron microscope. The scanning electron microscope pictures of FIGS. 11 (a) to (d) are photographs in which the phase synthesis temperatures in the step of preparing the first seed as illustrated in FIG. 9 are changed into 1100° C., 1125° C., 1150° C., and 1175° C., respectively.

With reference to FIG. 11, it can be seen that the size of the first seed is about 5 to 10 μm when the phase synthesis temperature in the step of preparing the first seed is adjusted to 1100° C.

Next, it can be seen that the size of the first seed increases significantly when the phase synthesis temperature is adjusted to 1125° C. and the size of the first seed slightly increases when the phase synthesis temperature is adjusted to 1150° C.

Next, it can be seen that, when the phase synthesis temperature is adjusted to 1175° C., the size of the first seed grows in the form of a giant plate of 20 μm or more and the seed is agglomerated into a lump, making it difficult to use as a seed.

Figure 12:
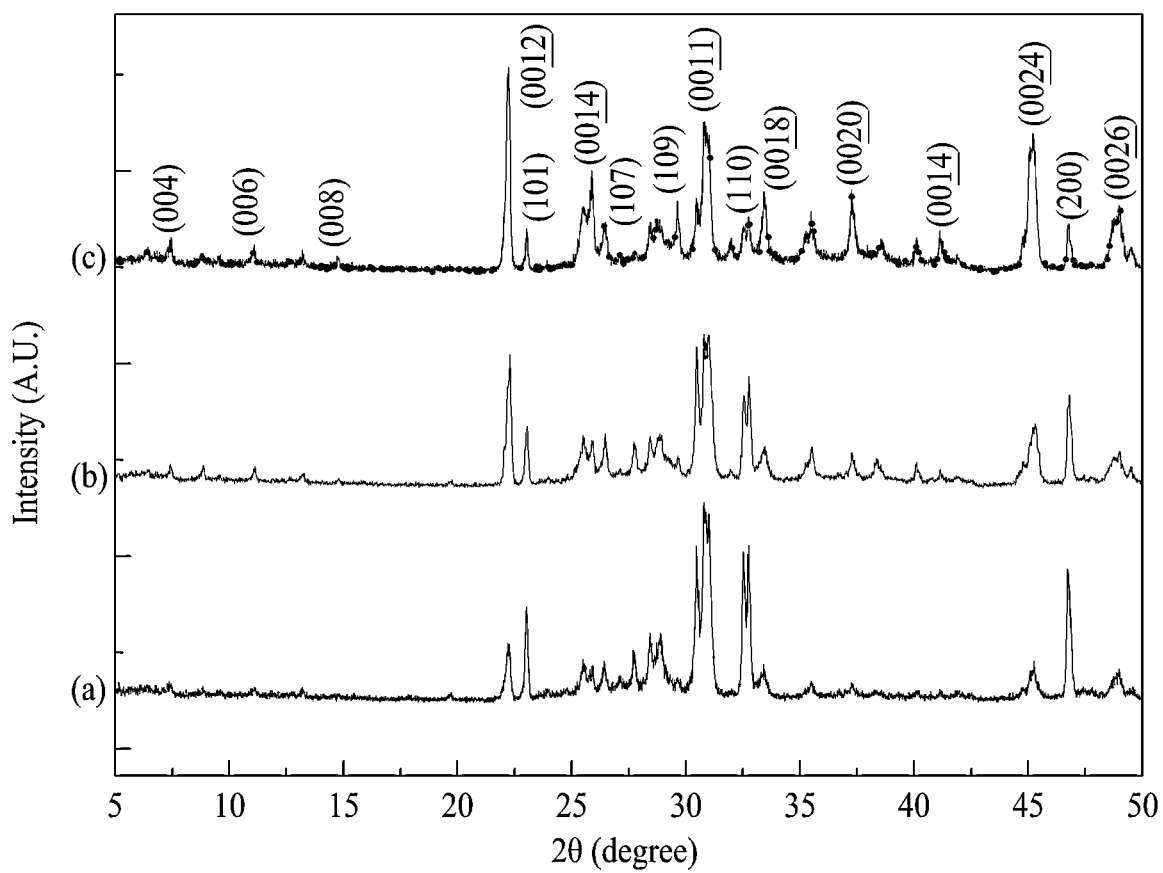
FIG. 12 is a graph showing XRD data measured for the seeds (a), (b) and (c) of FIG. 11.

FIG. 12 is a graph showing XRD data measured for the seeds (a), (b), and (c) of FIG. 11. In FIG. 12, the XRD diffraction peaks shown as (a), (b), and (c) are obtained by measuring the first seed obtained by setting the phase synthesis temperature to 1100° C., 1125° C., and 1150° C. in the step of preparing the first seed, respectively.

With reference to FIG. 12, it can be seen that, as the phase synthesis temperature increases in the step of preparing the first seed, the peak values of diffraction planes (004), (006), and (008), which are diffraction planes related to (001) are clear. Through this, it can be seen that as the phase synthesis temperature in the step of preparing the first seed increases, the plate-shaped BNN seed having a layered structure is easily generated. Here, (001) can be "1" in (hkl) representing a plane index of Miller indices.

In addition, at near 22°, as for a ratio of a peak value of the (0012) diffraction plane, which is a plate-shaped diffraction plane, to a peak value of the (101) diffraction plane, which represents a thickness of the seed, it can be seen that an XRD peak of FIG. 12(c) is excellent. Here, the ratio of the peak value of (0012) diffraction plane and the peak value of (101) diffraction plane can be considered as a measure of the aspect ratio of the first seed.

Figure 13:
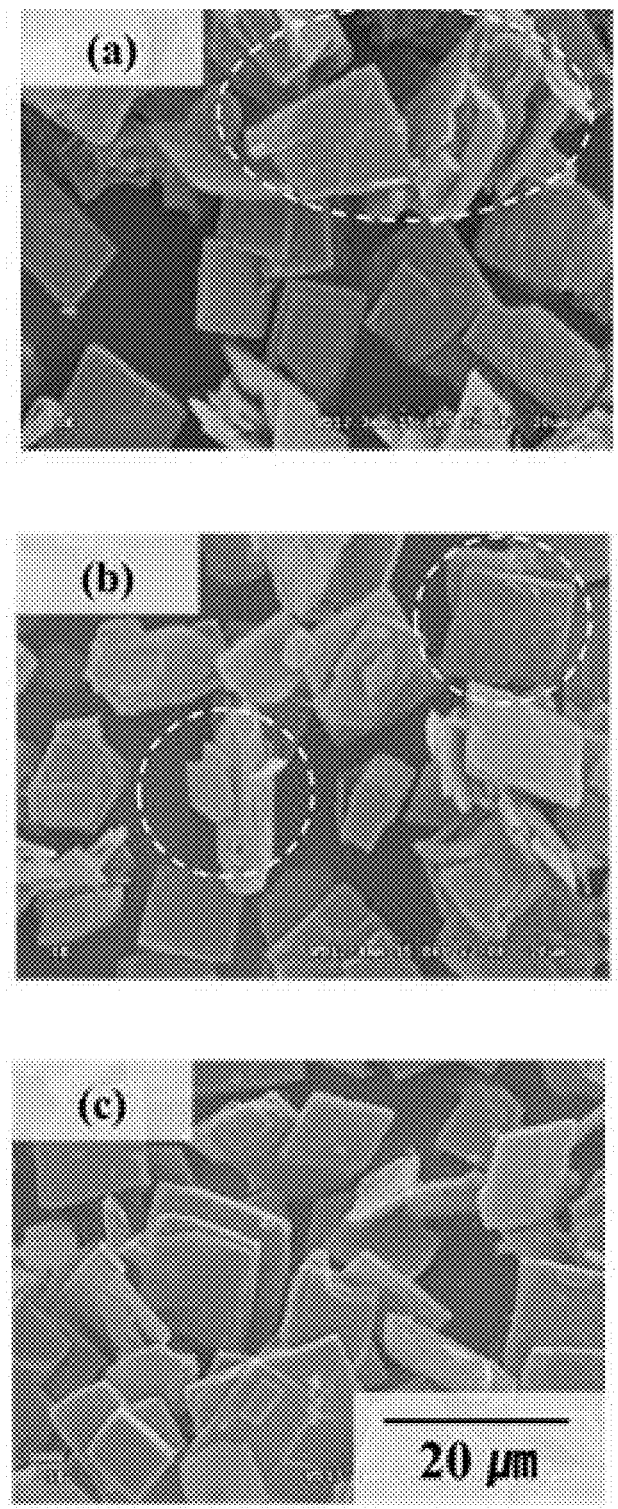
FIG. 13 is a scanning electron microscope photograph taken according to washing conditions in a second seed preparation step of FIG. 9.

FIG. 13 is a scanning electron microscope photograph taken according to washing conditions in the second seed preparation step of FIG. 9. The scanning electron microscope photograph of FIG. 13(a) is a photograph taken after topochemical reaction in the step of preparing the second seed, washed with a 60% concentration of nitric acid solution for 1 hour, and then dried. The scanning electron micrograph of FIG. 13(b) is a photograph taken after topochemical reaction in the step of preparing the second seed, washed with a 30% concentration of nitric acid solution for 2 hours, and then dried. The scanning electron micrograph of FIG. 13(c) is a photograph taken after topochemical reaction in the step of preparing the second seed, washed with a 60% concentration of nitric acid solution for 30 minutes, washed again with a 10% concentration of nitric acid solution for 1 hour, and then dried.

With reference to the scanning electron micrograph of FIG. 13(a), it can be seen that, when an acid treatment is performed with a 60% concentration of nitric acid solution for 1 hour, peeling occurs on the surface of the second seed and the plate shape collapses (see the circled region in FIG. 13(a)).

With reference to the scanning electron micrograph of FIG. 13(b), it can be seen that, when an acid treatment is performed with a 30% concentration of nitric acid solution for 2 hours, the plate shape of the second seed does not collapse but surface peeling occurs and agglomeration occurs in some NN seeds (see the circled region in FIG. 13(b)).

With reference to the scanning electron micrograph of FIG. 13(c), it can be seen that, when washing is performed with a 60% concentration of nitric acid solution for 30 minutes and then acid treatment is performed with a 10% concentration of nitric acid solution for 1 hour, the NN seed having an excellent surface state is obtained.

Figure 14:
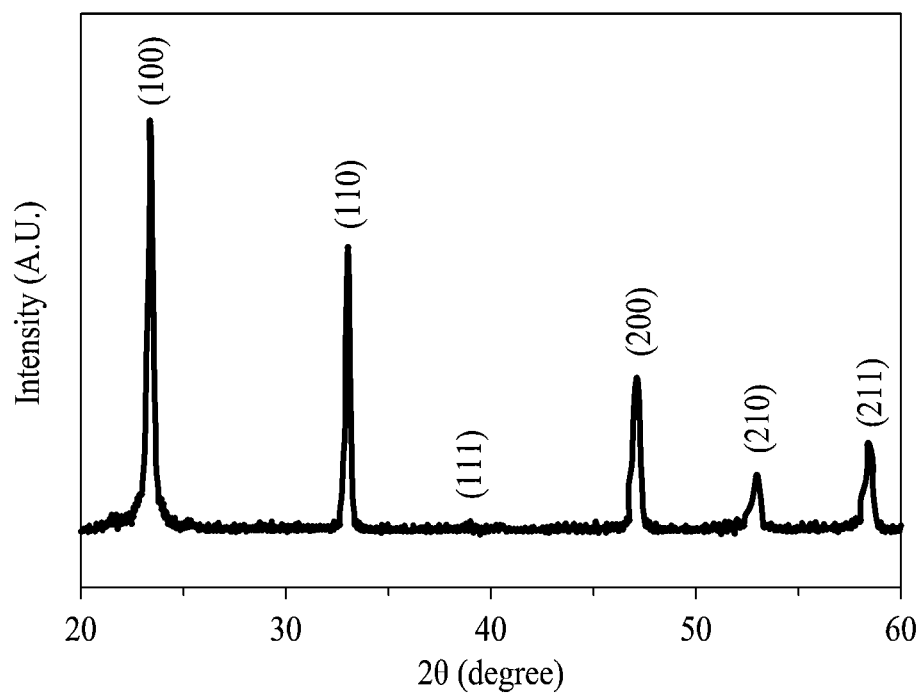
FIG. 14 is a graph showing XRD data measured after washing a second seed prepared by FIG. 9.

FIG. 14 is a graph showing XRD data measured after washing the second seed prepared by FIG. 9. The XRD peak obtained in FIG. 14 is measured with a dried second seed after washing the second seed prepared after the topochemical reaction described in FIG. 10 with a nitric acid-based solution.

With reference to FIG. 14, it can be seen that the NN second seed is formed of a perovskite phase without a second phase, and in particular, it can be seen that the second seed is grown well in the (001) direction when with reference to that the peak intensity in the (100) direction is the largest.

FIGS. 15A to 15D are graphs showing XRD data measured by adjusting a mixing ratio of the second seed to the first seed in the step of weighing and adjusting a sintering temperature in the step of sintering in the method for fabricating a composition of a piezoelectric material according to an embodiment of the present disclosure.

In FIGS. 15A to 15D, the NN seed was adjusted to 1, 3, 5, and 7 mol % for the composition of a piezoelectric material to prepare a molded body, and each prepared molded body was heated to 1160° C. and maintained for 6 hours by changing the temperature to 1000° C., 1030° C., 1060° C., and 1070° C. which are second sintering temperature, and then, XRD diffraction data was measured for each specimen.

Figure 15A:
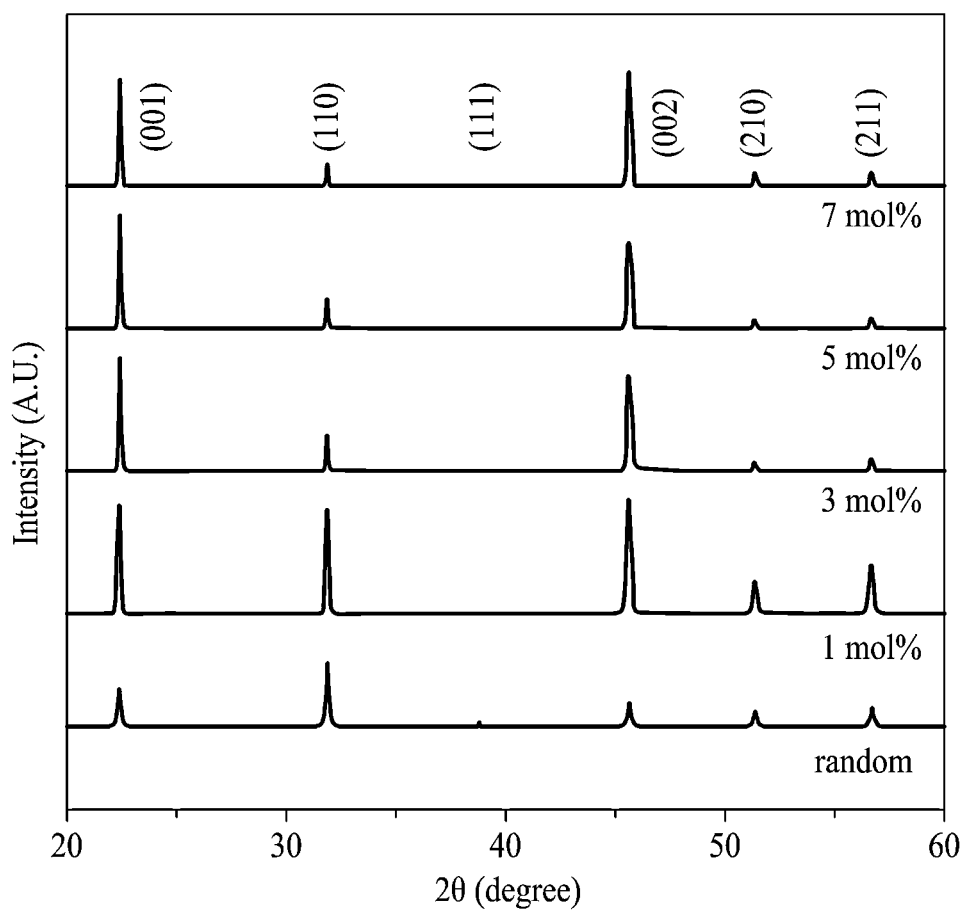
FIGS. 15A to 15D are graphs showing XRD data measured by adjusting a mixture ratio of a second seed to a first seed in a weighing step and adjusting a sintering temperature in a sintering step in a method for fabricating a composition of a piezoelectric material according to an embodiment of the present disclosure.
Figure 15B:
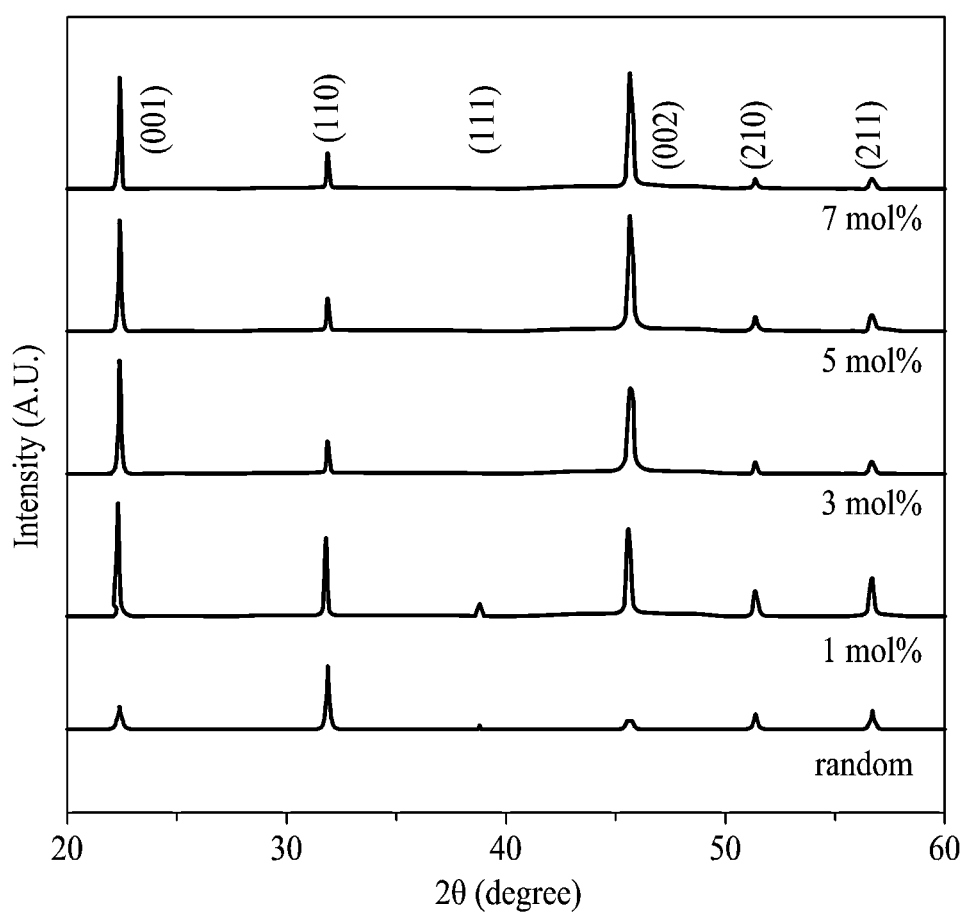
Figure 15C:
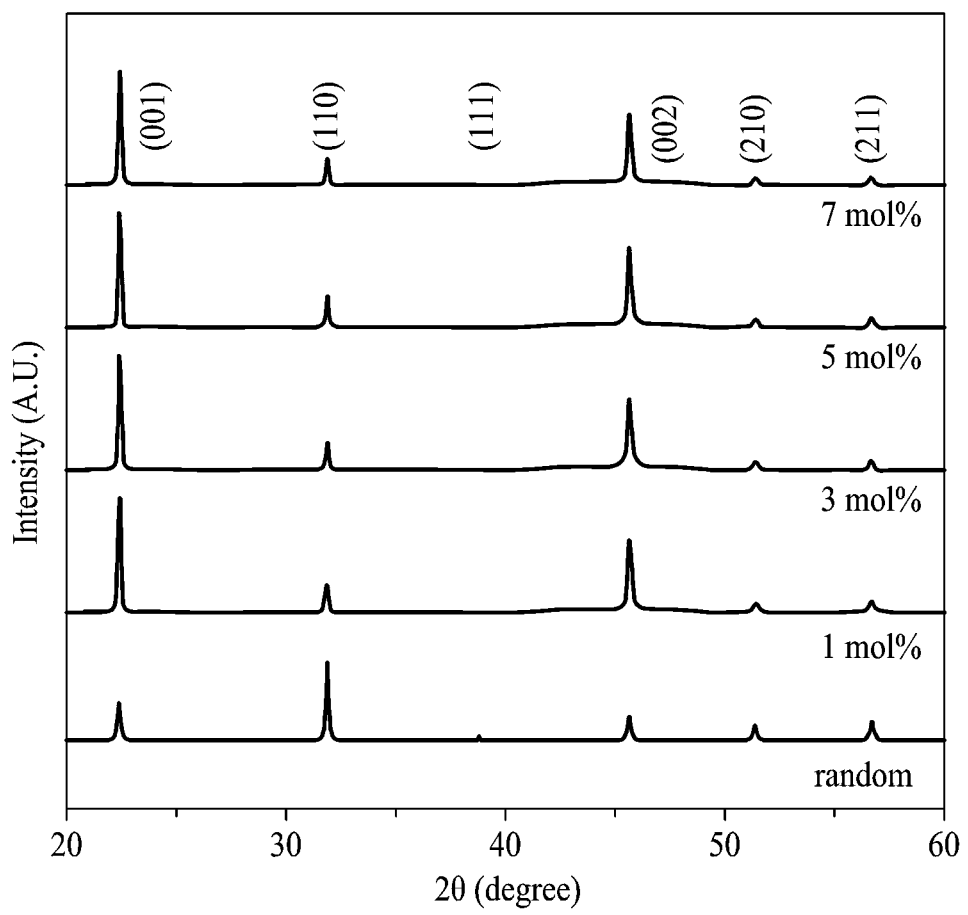
Figure 15D:
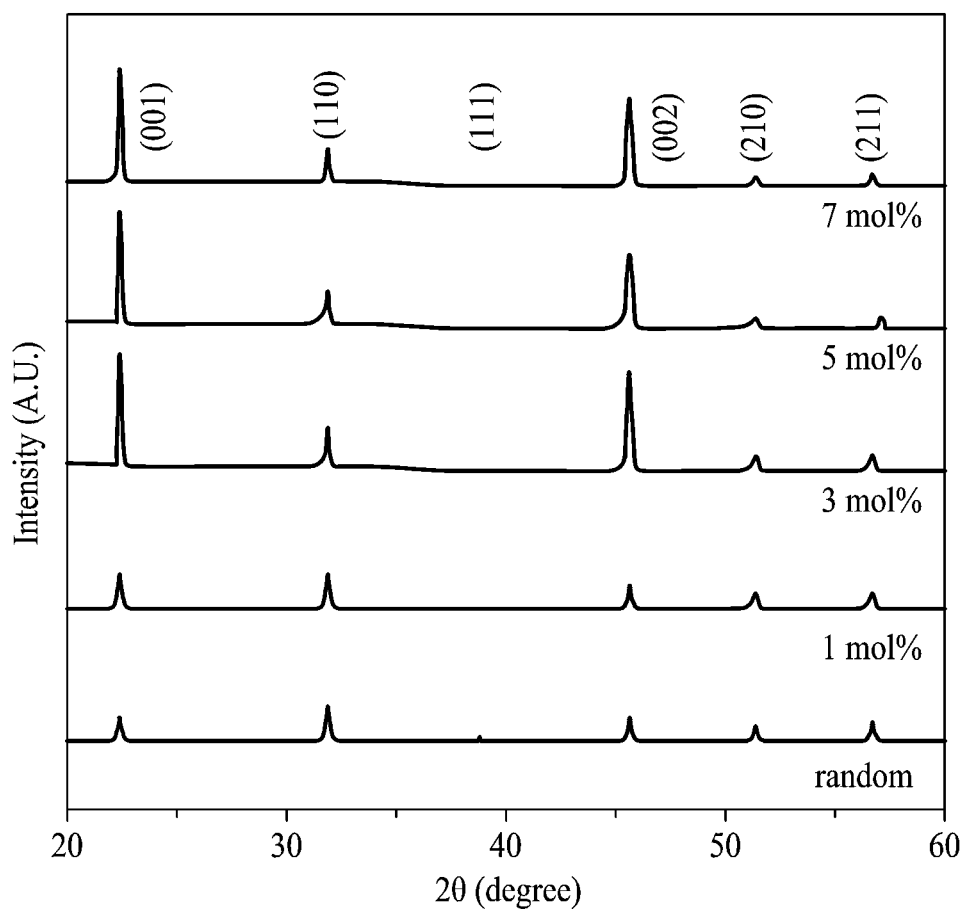

FIG. 15A shows XRD diffraction data for each specimen after heating up to 1160° C., which is a first sintering temperature, and then changing to 1000° C., which is the second sintering temperature, and maintaining for 6 hours for sintering. FIG. 15B shows XRD diffraction data for each specimen after heating up to 1160° C., which is a first sintering temperature, and then changing to 1030° C., which is the second sintering temperature, and maintaining for 6 hours for sintering. FIG. 15C shows XRD diffraction data for each specimen after heating up to 1160° C., which is a first sintering temperature, and then changing to 1060° C., which is the second sintering temperature, and maintaining for 6 hours for sintering. FIG. 15D show XRD diffraction data for each specimen after heating up to 1160° C., which is a first sintering temperature, and then changing to 1070° C., which is the second sintering temperature, and maintaining for 6 hours for sintering.

In FIGS. 15A to 15D, the degree of orientation of the composition of a piezoelectric material according to an embodiment of the present disclosure in which the sintering step is completed can be confirmed by the relative fractions of the integral area of the diffraction peaks of (001) and (002) expressed as (001) indicating the orientation in one direction and the integral area of the diffraction peaks of (110), (111), (210), and (211) not expressed as (001).

First, the degree of orientation (p) can be calculated by Equation (1) below.

$$p = \frac{\Sigma I_{00\ell}}{\Sigma I_{00\ell} + \Sigma I_{non\text{-}00\ell}}$$ [Equation 1]

Here, $I_{(001)}$ is the diffraction peaks of (001) and (002) expressed as (001), and $I_{non\text{-}(001)}$ is diffraction peaks of 110, (111), (210, and (211) which are not expressed as (001).

Next, the lotgering factor (Lf (%)) can be calculated by Equation (2) below.

$$L_f(\%) = \frac{p - p_0}{1 - p_0}$$ [Equation 2]

Here, P is the degree of orientation calculated by Equation (1) above, and $P_0$ is the fraction of $I_{001}$ in the randomly oriented piezoelectric material composition of the same composition.

With reference to FIGS. 15A to 15D, in the case of a specimen to which 1 mol % of the second seed is added, it can be seen that, a low degree of orientation is shown up to 1030° C., a sharp degree of orientation is shown at 1060° C., and the degree of orientation is reduced again at 1070° C. For example, with reference to the graphs of FIGS. 15A and 15B, in the case of a specimen to which 1 mol % of the second seed is added, it can be seen that the diffraction peaks of (110), (210), and (211) are observed to some extent, in addition to the diffraction peaks of (001) and (002) expressed as (001) up to 1030° C. With reference to the graph of FIG. 15C, in the case of the specimen to which 1 mol % of the second seed is added, it can be seen that the diffraction peaks of (110, (210), and (211) are reduced as compared to the diffraction peaks of (001) and (002) when the second sintering temperature is increased to 1060° C. With reference to the graph of FIG. 15D, in the case of the specimen to which 1 mol % of the second seed is added, it can be seen that the diffraction peaks of (001) and (002) expressed as (001) is reduced and the degree of orientation is reduced again when the second sintering temperature is increased to 1070° C.

Next, in the case of the specimens to which 3, 5, and 7 mol % of the second seed was added, stable orientation characteristics were observed regardless of the sintering temperature.

Figure 16A:
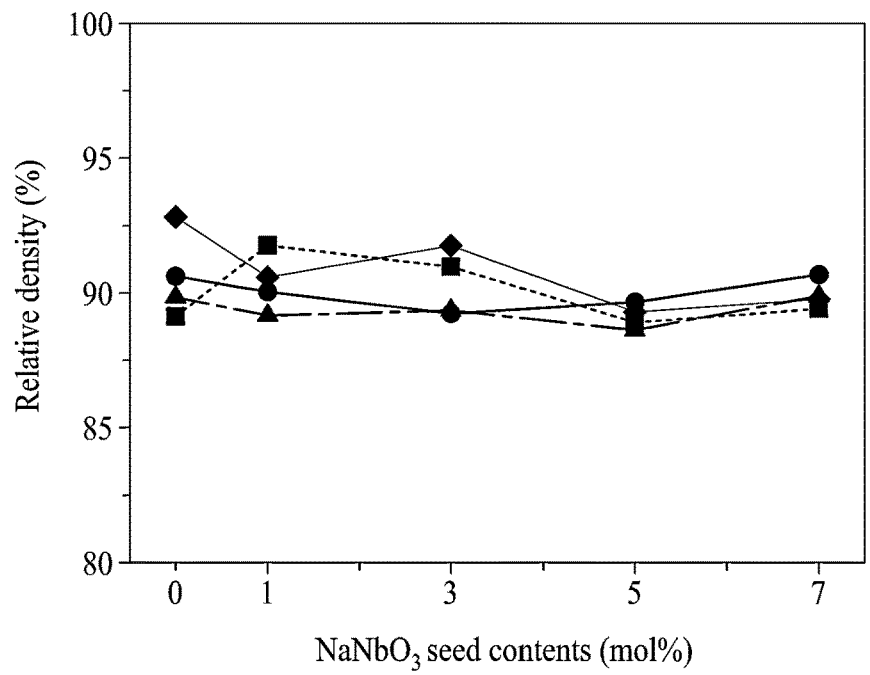
FIGS. 16A to 16C are graphs of a relative density, a maximum piezoelectric charge constant, and lotgering factor measured by adjusting a mixture ratio of a second seed to a first seed in a weighing step and adjusting a sintering temperature in a sintering step in a method for fabricating a composition of a piezoelectric material according to an embodiment of the present disclosure.
Figure 16B:
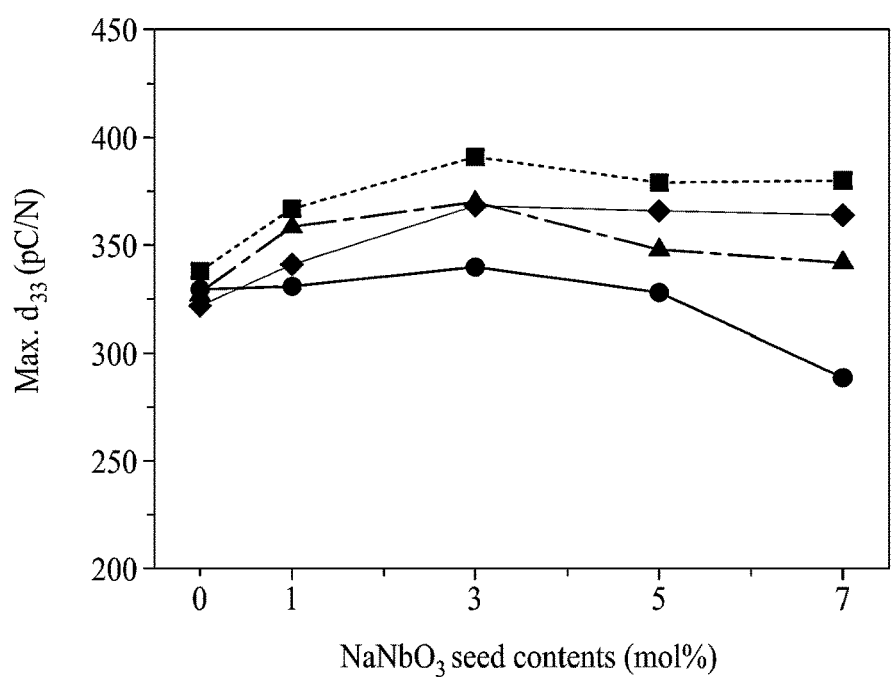
Figure 16C:
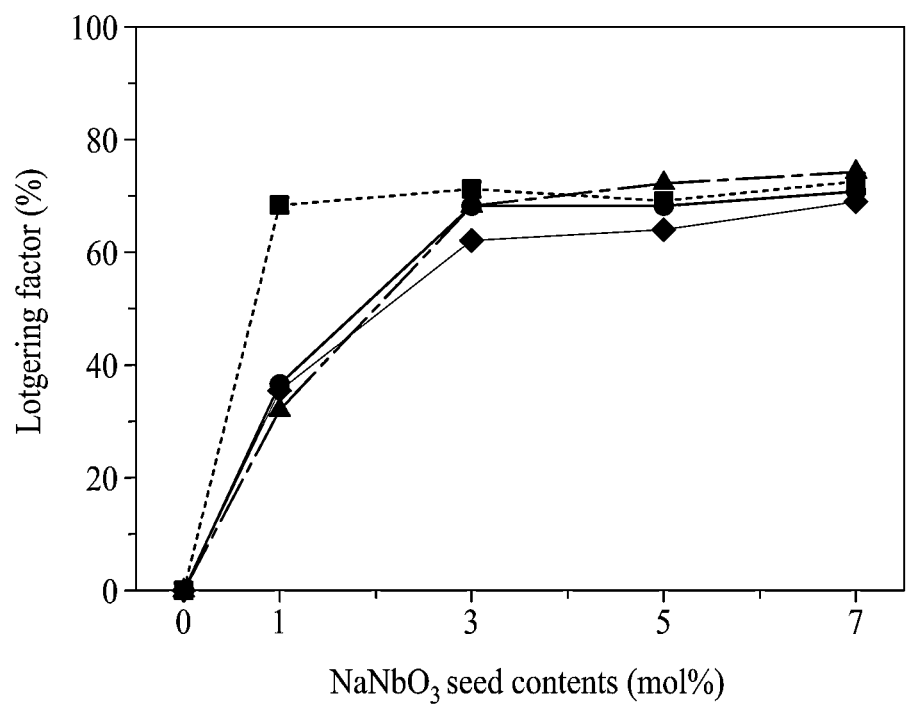

The lotgering factor calculated based on the diffraction data shown in FIGS. 15A to 15D is shown in FIG. 16C to be described later.

FIGS. 16A to 16C are graphs showing relative density, maximum piezoelectric charge constant, and lotgering factor measured by adjusting the mixing ratio of the second seed to the first seed in the step of weighing and adjusting a sintering temperature in the step of sintering in the method for fabricating a composition of a piezoelectric material according to an embodiment of the present disclosure.

In FIGS. 16A to 16C, the thick solid line is a case of sintering by heating to 1160° C., which is a first sintering temperature, changing to 1000° C. or lower, which is a second sintering temperature, and then maintaining 6 hours, and the dashed-dotted line is a case of sintering by heating to 1160° C., which is a first sintering temperature, changing to 1030° C. or lower, which is a second sintering temperature, and then maintaining 6 hours. The dotted line is a case of sintering by heating to 1160° C., which is a first sintering temperature, changing to 1060° C. or lower, which is a second sintering temperature, and then maintaining 6 hours, and a thin sold line is a case of sintering by heating to 1160° C., which is a first sintering temperature, changing to 1070° C. or lower, which is a second sintering temperature, and then maintaining 6 hours.

With reference to FIG. 16A, when the second sintering temperature is set to a condition of 1030° C. or lower, the relative density indicates a sintering density of about 88% to 91%, and when it is set to a condition of 1060° C. or higher, the relative density indicates a sintering density of 89% to 92%. Therefore, it can be seen that the relative density slightly increases as the second sintering temperature is increased.

With reference to FIG. 16B, it can be seen that the maximum piezoelectric charge constant is improved as the second sintering temperature increases in the range of 1000° C. to 1060° C., and decreases at 1070° C., compared to 1060° C.

In addition, it can be seen that the maximum piezoelectric charge constant has a tendency to increase when an addition ratio of the second seed is up to 3 mol %, and to decrease when the second seed is added by 5 mol % or more.

The maximum piezoelectric charge constant of the composition of a piezoelectric material was 322 pC/N when the second seed was not added under the condition where the second sintering temperature was 1060° C., and the maximum piezoelectric charge constant of the composition of a piezoelectric material was 400 pC/N when 3 mol % of second seed was added under the condition where the second sintering temperature was 1060° C., indicating improvement of the properties by about 21%.

With reference to FIG. 16C, the lotgering factor indicating the degree of orientation tends to increase as the content of the second seed increases, but is saturated in the range of about 60% to 70% in the condition where the second seed is 3 mol % or more.

Therefore, with reference to FIGS. 16A to 16C, it can be seen that, when the NN seed, which is a second seed, is added to the composition of a piezoelectric material in excess of 3 mol %, the orientation effect is not significantly improved, and the piezoelectric properties are decreased.

Figure 17:
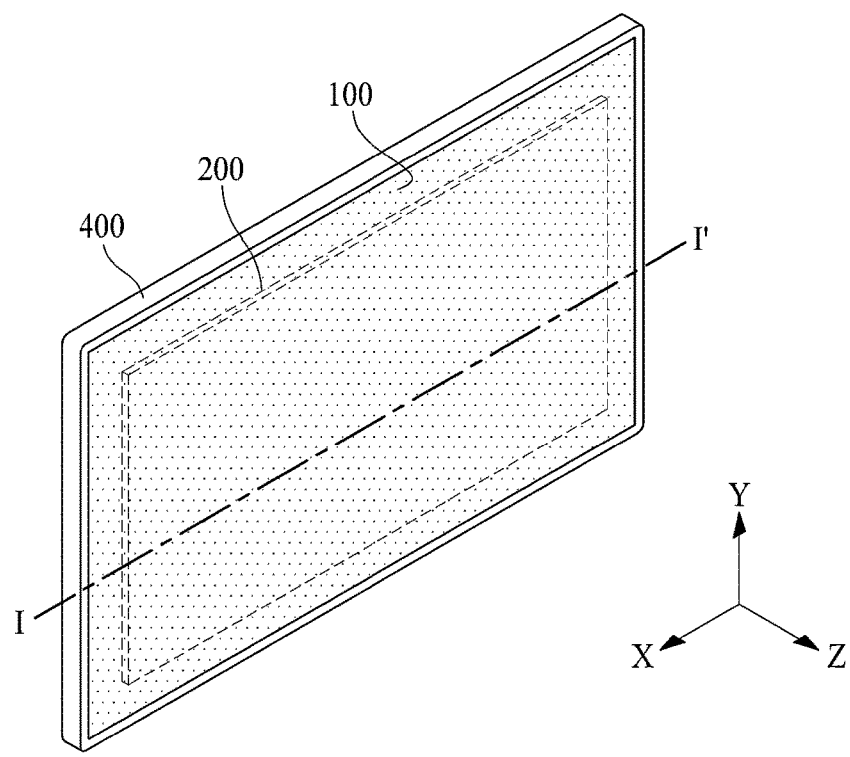
FIG. 17 is a perspective view of a display apparatus according to an embodiment of the present disclosure.
Figure 18:
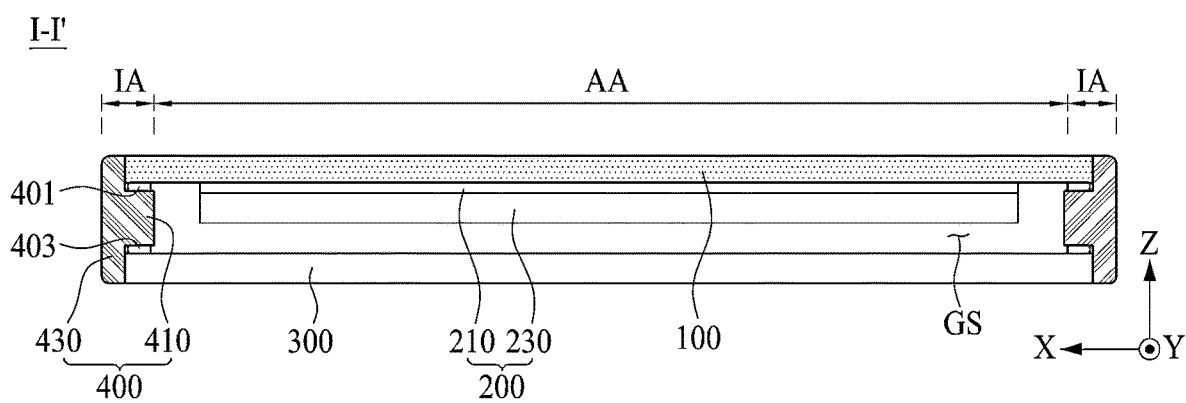
FIG. 18 is a cross-sectional view taken along line I-I' of FIG. 17.

FIG. 17 is a perspective view of a display apparatus according to an embodiment of the present disclosure, and FIG. 18 is a cross-sectional view taken along line I-I' of FIG. 17. All the components of each display apparatus according to all embodiments of the present disclosure are operatively coupled and configured.

With reference to FIGS. 17 and 18, the display apparatus according to the embodiment of the present disclosure can include a display panel 100 configured to display an image and a piezoelectric device 200 for vibrating the display panel 100 from a rear surface (or back surface) of the display panel 100.

The display panel 100 can be configured to display an image, for example, an electronic image or a digital image. For example, the display panel 100 can display an image by outputting light. The display panel 100 can be any type of display panel such as a liquid crystal display panel, an organic light emitting display panel, a quantum dot light emitting display panel, a micro light emitting diode display panel, and an electrophoretic display panel or curved display panel. The display panel 100 can be a flexible display panel. For example, the display panel 100 can be a flexible light emitting display panel, a flexible electrophoretic display panel, a flexible electrowetting display panel, a flexible micro light emitting diode display panel, or a flexible quantum dot light emitting display panel, but embodiments of the present disclosure are not limited thereto.

The display panel 100 according to an embodiment of the present disclosure can include a display region AA configured to display an image according to the driving of a plurality of pixels. Further, the display panel 100 can further include a non-display region IA surrounding the display region AA, but embodiments of the present disclosure are not limited thereto.

The piezoelectric device 200 can vibrate the display panel 100 from the rear surface of the display panel 100 to provide acoustic and/or haptic feedback to the user based on the vibration of the display panel 100. The piezoelectric device 200 can be implemented on the rear surface of the display panel 100 to directly vibrate the display panel 100.

As an embodiment of the present disclosure, the piezoelectric device 200 can vibrate according to a vibration driving signal synchronized with an image displayed on the display panel 100 to vibrate the display panel 100. As another embodiment, the piezoelectric device 200 can vibrate according to a haptic feedback signal (or a tactile feedback signal synchronized with a user's touch on a touch panel (or touch sensor layer) disposed on the display panel 100 or built in the display panel 100 to vibrate the display panel 100. Accordingly, the display panel 100 can vibrate according to the vibration of the piezoelectric device 200 to provide at least one of acoustic and haptic feedback to a user (or a viewer).

The piezoelectric device 200 according to an embodiment of the present disclosure can be implemented with a size corresponding to a display region AA of the display panel 100. A size of the piezoelectric device 200 can be 0.9 to 1.1 times the size of the display region AA, but embodiments of the present disclosure are not limited thereto. For example, the size of the piezoelectric device 200 can be the same as or smaller than the size of the display region AA. For example, since the size of the piezoelectric device 200 can be the same as or approximately the same as the size of the display region AA of the display panel 100, the piezoelectric device 200 can cover most of the region of the display panel 100.

In addition, since vibration generated by the piezoelectric device 200 can vibrate the entire display panel 100, localization of sound can be high and user's satisfaction can be improved. In addition, since a contact area (or panel coverage) between the display panel 100 and the piezoelectric device 200 increases, a vibration region of the display panel 100 can increase, so that a mid-low range sound generated according to the vibration can be improved. In addition, since the piezoelectric device 200 applied to a large-sized display apparatus can vibrate the entire large (or large-area) display panel 100, localization of sound according to the vibration of the display panel 100 can be further improved to implement improved sound effects. Accordingly, since the piezoelectric device 200 according to an embodiment of the present disclosure is disposed on the rear surface of the display panel 100 to sufficiently vibrate the display panel 100 in an up-down (or front-rear) direction, sound can be output forwards from the device or the display apparatus.

The piezoelectric device 200 according to an embodiment of the present disclosure can be implemented in the form of a film. Since the piezoelectric device 200 is implemented in the form of a film, it can have a thickness smaller than that of the display panel 100, so that an increase in the thickness of the display apparatus due to the arrangement of the piezoelectric device 200 can be minimized. For example, the piezoelectric device 200 can be expressed as a sound generating module using the display panel 100 as an acoustic diaphragm, a sound generating apparatus, a film actuator, a film-type piezoelectric composite actuator, a film speaker, a film-type piezoelectric speaker, or a film type piezoelectric composite speaker, etc., but is not limited to this term.

In another embodiment, the piezoelectric device 200 may not be disposed on the rear surface of the display panel 100 and can be applied to a vibration object other than the display panel. For example, the vibration object can be a non-display panel, wood, plastic, glass, cloth, an interior material of a vehicle, a glass window of a vehicle, an indoor ceiling of a building, a glass window of a building, an interior material of an aircraft, and a glass window of an aircraft, and the like, but embodiments of the present disclosure are not limited thereto. For example, the non-display panel can be a light emitting diode lighting panel (or apparatus), an organic light emitting lighting panel (or apparatus), or an inorganic light emitting lighting panel (or apparatus), but embodiments of the present disclosure are not limited thereto. In this case, a vibration object (or a vibration member) can be applied as a diaphragm, and the piezoelectric device 200 can be configured to vibrate the vibration object to output sound.

The piezoelectric device 200 according to an embodiment of the present disclosure can further include a vibration structure 230 and a connection member 210 disposed between the vibration structure 230 and the display panel 100.

According to an embodiment of the present disclosure, the connection member 210 can include at least one base material and can include an adhesive layer attached to one or both surfaces of the base material, or can be configured as a single adhesive layer.

For example, the connection member 210 can include, but is not limited to, a foam pad, a double-sided tape, or an adhesive. For example, the adhesive layer of the connection member 210 can include, but is not limited to, epoxy, acryl, silicone, or urethane.

The apparatus according to an embodiment of the present disclosure can further include a support member 300 disposed on the rear surface of the display panel 100.

The support member 300 can cover the rear surface of the display panel 100. For example, the support member 300 can cover the entire rear surface of the display panel 100 with a gap space GS interposed therebetween. For example, the support member 300 can include at least one of a glass material, a metal material, and a plastic material. For example, the support member 300 can be a rear structure or a set structure. For example, the support member 300 can be expressed by other terms such as a cover bottom, a plate bottom, a back cover, a base frame, a metal frame, and a metal chassis, a chassis base, or m-chassis. Accordingly, the support member 300 can be implemented as any type of frame or plate-shaped structure disposed on the rear surface of the display panel 100.

The apparatus according to an embodiment of the present disclosure can further include a middle frame 400.

The middle frame 400 can be disposed between a rear periphery (or rear edge) of the display panel 100 and a front periphery (or front edge) of the support member 300. The middle frame 400 can support at least one of the periphery of the display panel 100 and the periphery of the support member 300 and surround at least one or more of side surfaces of the display panel 100 and the support member 300. The middle frame 400 can form the gap space GS between the display panel 100 and the support member 300.

The middle frame 400 can be expressed as a middle cabinet, a middle cover, or a middle chassis, and the term is not limited thereto.

The middle frame 400 according to an embodiment of the present disclosure can include a first support portion 410 and a second support portion 430.

The first support portion 410 is disposed between the rear periphery (or rear edge) of the display panel 100 and the front periphery (or front edge) of the support member 300, thereby forming the gap space GS between the display panel 100 and the support member 300. The front surface of the first support portion 410 can be coupled to or connected to the rear periphery portion of the display panel 100 via the first frame connection member 401. The rear surface of the first support portion 410 can be coupled to or connected to the front periphery portion of the support member 300 via the second frame connection member 403. For example, the first support portion 410 can have a single frame structure in a square shape or a frame structure having a plurality of divided bar shapes.

The second support portion 430 can be vertically coupled to an outer surface of the first support portion 410 so as to be parallel to the thickness direction Z of the apparatus. The second support portion 430 can enclose at least one of the outer surface of the display panel 100 and the outer surface of the support member 300 to protect the outer surface of each of the display panel 100 and the support member 300. The first support portion 410 can protrude from the inner surface of the second support portion 430 toward the gap space GS between the display panel 100 and the support member 300.

Figure 19:
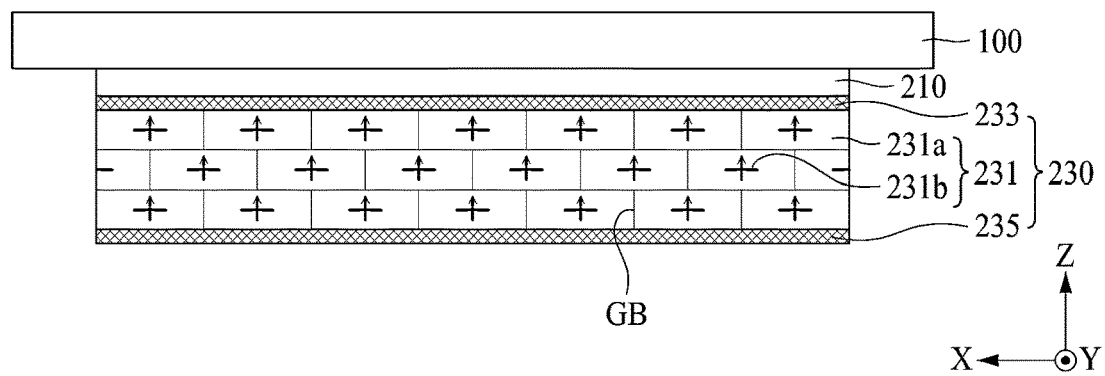
FIG. 19 is a detailed view showing a piezoelectric device of FIG. 18.

FIG. 19 is a detailed view showing an example of the piezoelectric device of FIG. 18.

With reference to FIG. 19, the piezoelectric device 200 according to an embodiment of the present disclosure can include a vibrating structure 230, and the vibrating structure 230 can include a piezoelectric device layer 231, a first electrode part 233 disposed on a first surface of the piezoelectric device layer 231, and a second electrode part 235 disposed on a second surface facing the first surface.

The piezoelectric device layer 231 includes a first material layer 231$a$ and a second material layer 231$b$ surrounded by the first material layer 231$a$. According to an embodiment of the present disclosure, one first material layer 231$a$ and one second material layer 231$b$ can form one grain having the same crystal orientation, and a grain boundary (GB) can be formed in a portion in which the one first material layer 231$a$ and the second material layer 231$b$ are in contact with another first material layer 231$a$ and another second material layer 231$b$ forming another adjacent grain.

According to an embodiment of the present disclosure, a grain of the first material layer 231$a$ is grown based on the crystal orientation of the second material layer 231$b$, and the plurality of first material layers 231$a$ can have the same crystal orientation. For example, the plurality of first material layers 231$a$ can have a (001) crystal orientation.

For the first electrode part 233 and the second electrode part 235, a metal electrode used in the field of piezoelectric devices can be used, and, for example, a silver electrode can be used.

In addition, although the vibrating structure 230 in FIG. 19 is shown as a single layer, it can be configured to be additionally stacked according to a required performance value of the piezoelectric device.

Figure 20A:
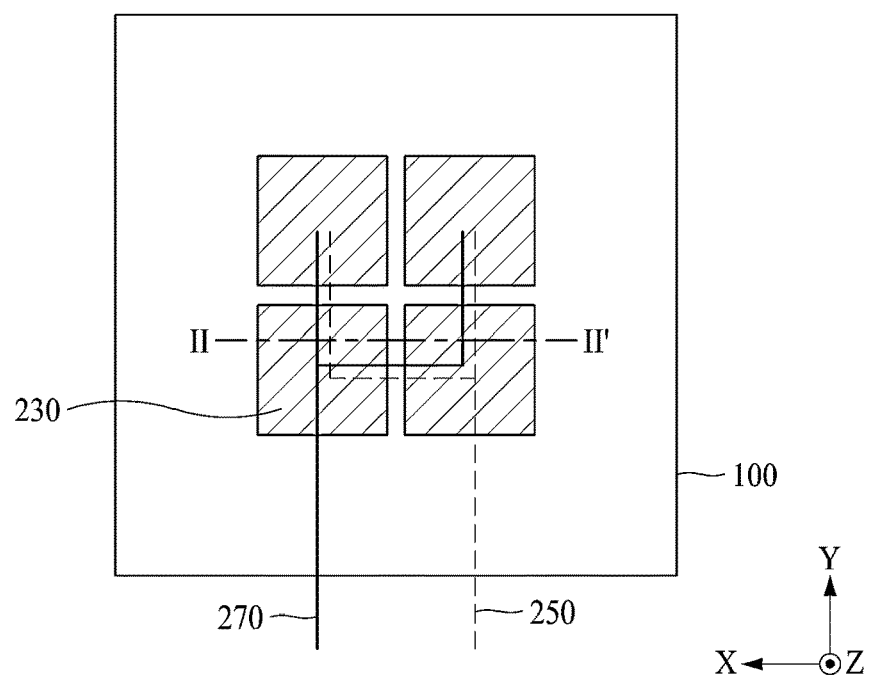
FIGS. 20A to 20C illustrate experimental conditions for measuring sound pressure characteristics of a piezoelectric device according to an embodiment of the present disclosure.
Figure 20B:
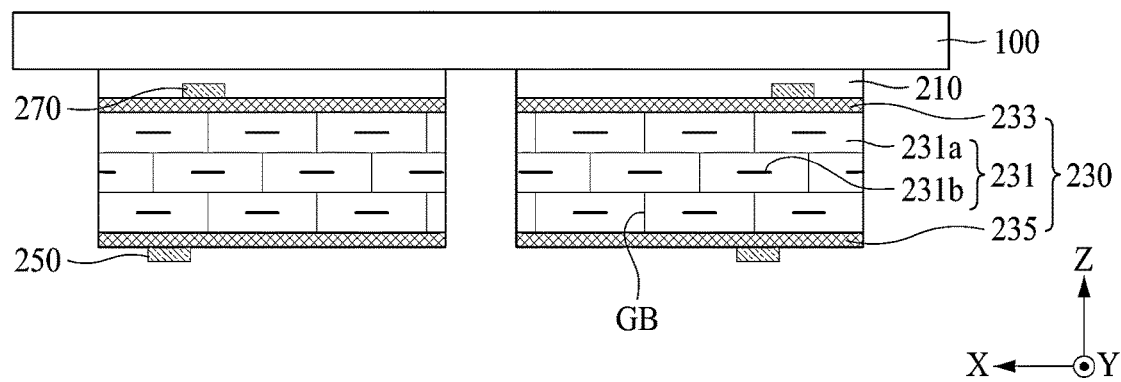
Figure 20C:
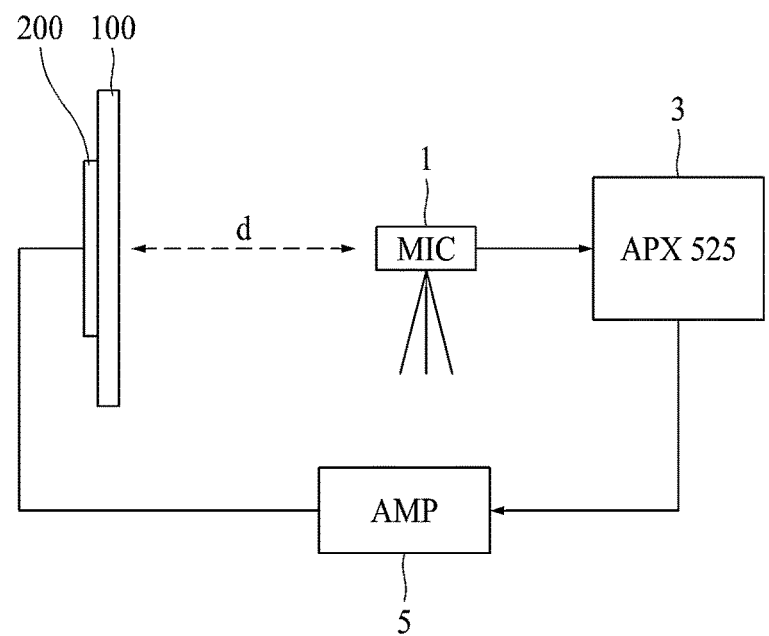

FIGS. 20A to 20C illustrate experimental conditions for measuring sound pressure characteristics of a piezoelectric device according to an embodiment of the present disclosure.

With reference to FIGS. 20A and 20B, a square piezoelectric device 200 having a width and length of 60 mm was connected in parallel as four arrays of two rows and two columns in a tile form. At this time, the piezoelectric device layer 231 of the piezoelectric device 200 was formed to have a thickness of 0.5 mm, and a width and length of the piezoelectric device layer 231 were formed to have a width of 60 mm, the same as that of the piezoelectric device 200. In addition, the first electrode part 233 and the second electrode part 235 on the upper and lower portions of the piezoelectric device layer 231 were formed of silver electrodes, and a first electrode connection line 270 and a second electrode connection line 250 for applying a driving voltage were connected to one surface of each of the first electrode part 233 and the second electrode part 235.

With reference to FIG. 20C, sound pressure measurement was performed using the APX525 apparatus of Audio Precision, which is a commercial equipment, and while setting an input voltage to 5 Vrms, sine sweeping was performed so that a signal was amplified through an amplifier AMP and applied to the lead-free piezoelectric device 200 within a range of 100 Hz to 20 kHz, the sound pressure was measured using a microphone (MIC) at a position 30 cm away from the display panel, and sound pressure measured using the APX525 of Audio Precision was recorded. At this time, the measured sound pressure was corrected by ⅓ octave smoothing. The sine sweeping can be a method of sweeping in a short time, but embodiments of the present disclosure are not limited thereto.

Figure 21:
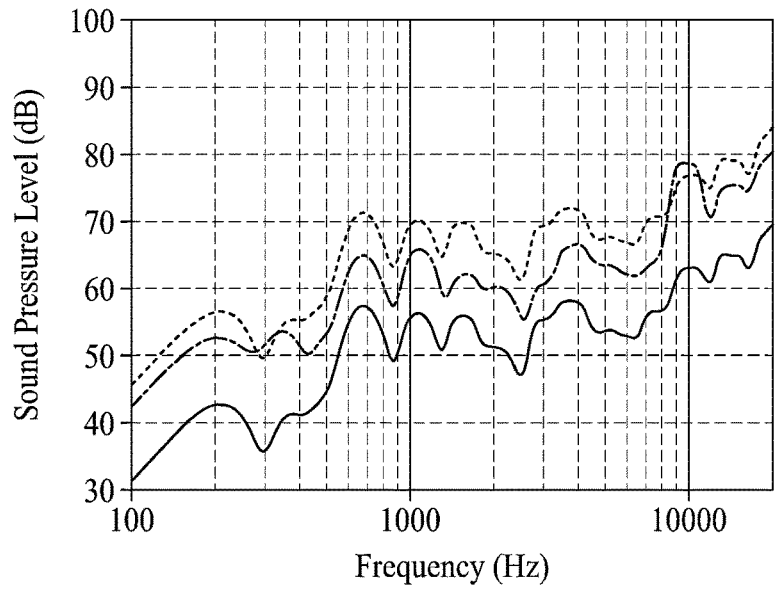
FIG. 21 is a graph showing frequency-sound pressure characteristics according to an antimony content of a piezoelectric layer of a piezoelectric device according to an embodiment of the present disclosure.
Figure 22:
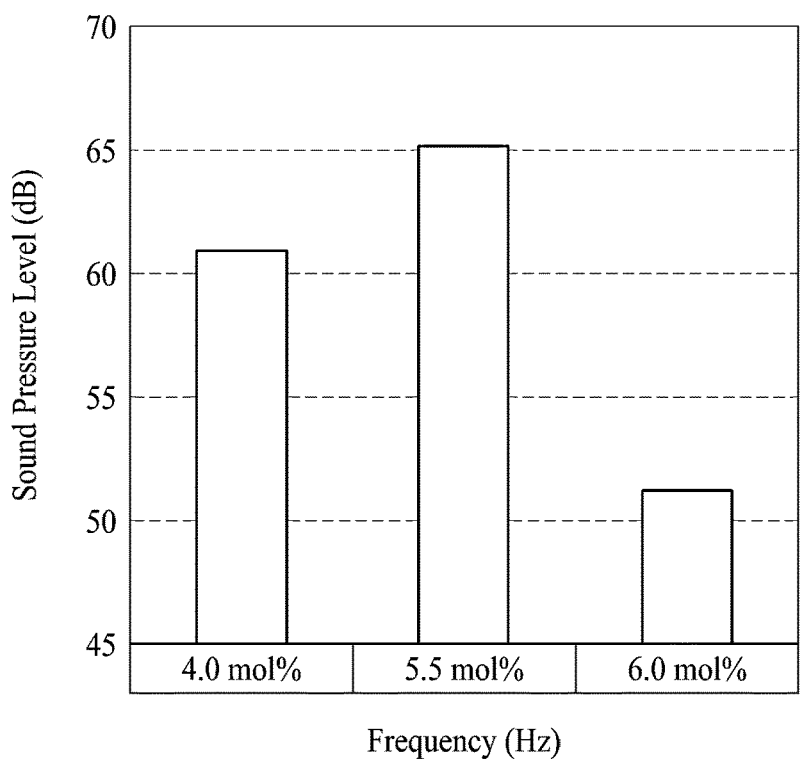
FIG. 22 is a graph showing sound pressure level characteristics according to an antimony content of the piezoelectric layer of a piezoelectric device according to an embodiment of the present disclosure.

FIG. 21 is a graph showing frequency-sound pressure characteristics according to an antimony content of the piezoelectric layer of a piezoelectric device according to an embodiment of the present disclosure, and FIG. 22 is a graph showing sound pressure characteristics according to an antimony content of the piezoelectric layer of a piezoelectric device according to an embodiment of the present disclosure. In FIG. 21, the horizontal axis represents frequency (hertz) (Hz), and the vertical axis represents sound pressure level (decibel) (dB).

Table 1 below shows that the average sound pressure is extracted by dividing the measured values of sound pressure according to the frequency measured in FIG. 21 into low-pitched, mid-pitched, and high-pitched sound band ranges.

TABLE 1

|  | Frequency range | Sb 4.0 mol % (x = 0.040) | Sb 5.5 mol % (x = 0.055) | Sb 6.0 mol % (x = 0.060) |
| --- | --- | --- | --- | --- |
| Low pitched sound band range | 100 Hz to 1 kHz | 53.7 | 57.6 | 43.6 |
| Middle pitched sound band range | 1 kHz to 10 kHz | 63.6 | 68.7 | 54.8 |
| High pitched sound band range | 10 kHz to 20 kHz | 75.8 | 78.7 | 64.6 |
| full range | 100 Hz to 20 kHz | 60.9 | 65.2 | 51.2 |

With reference to FIGS. 21 and 22 and Table 2, when 4.0 mol % of antimony (Sb) included in the piezoelectric layer 231 of the piezoelectric device according to an embodiment of the present disclosure is added, an average sound pressure level in the full range of a frequency range of 100 Hz to 20 kHz was 60.9 dB, an average sound pressure level of the low pitched sound band in the frequency range of 100 Hz to 1 kHz was 53.7 dB, an average sound pressure level of the middle pitched sound band of the frequency range of 1 kHz to 10 kHz was 63.6 dB, and an average sound pressure level of a high pitched sound band of the frequency range of 10 kHz to 20 kHz was 76.8 dB.

Next, when 5.5 mol % of antimony (Sb) included in the piezoelectric layer 231 of the piezoelectric device according to an embodiment of the present disclosure is added, an average sound pressure level in the full range of a frequency range of 100 Hz to 20 kHz was 65.2 dB, an average sound pressure level of the low pitched sound band in the frequency range of 100 Hz to 1 kHz was 57.6 dB, an average sound pressure level of the middle pitched sound band of the frequency range of 1 kHz to 10 kHz was 68.7 dB, and an average sound pressure level of a high pitched sound band of the frequency range of 10 kHz to 20 kHz was 78.7 dB.

Next, when 6.0 mol % of antimony (Sb) included in the piezoelectric layer 231 of the piezoelectric device according to an embodiment of the present disclosure is added, an average sound pressure level in the full range of a frequency range of 100 Hz to 20 kHz was 51.2 dB, an average sound pressure of the low pitched sound band in the frequency range of 100 Hz to 1 kHz was 43.6 dB, an average sound pressure level of the middle pitched sound band of the frequency range of 1 kHz to 10 kHz was 54.8 dB, and an average sound pressure of a high pitched sound band of the frequency range of 10 kHz to 20 kHz was 64.6 dB.

Therefore, with reference to FIGS. 21 and 22, and Table 2, it can be seen that, when 5.5 mol % of antimony (Sb) included in the piezoelectric layer 231 of the piezoelectric device according to an embodiment of the present disclosure is added, the average sound pressure level is about 65.2 dB, which is about 4.3 dB higher than that of a piezoelectric device with an antimony (Sb) content of 4.0 mol %, and about 14.0 dB higher than a piezoelectric device with an antimony (Sb) content of 6.0 mol %. In addition, it can be seen that when the antimony (Sb) content of the piezoelectric layer 231 of the piezoelectric device is 5.5 mol %, the sound pressure characteristics are improved in all the low-pitched, mid-pitched, and high-pitched sound band ranges.

A composition of a piezoelectric material, a method for fabricating the same, a piezoelectric device, and a display apparatus including a lead-free piezoelectric device according to one or more embodiments of the present disclosure can be described as follows.

According to some embodiments of the present disclosure, a composition can comprise a piezoelectric material according to Chemical Formula 1.

$(1-y)(Na_aK_{1-a})(Nb_{1-x}Sb_x)-ySrZrO_3 + n$ mol % [Chemical Formula 1]

Here, y is $0.01 \leq y \leq 0.10$, a is $0.4 \leq a \leq 0.6$, x is $0 \leq x \leq 0.06$, and n is $0.5 \leq n \leq 1.5$.

According to some embodiments of the present disclosure, x can be 0.04 to 0.055.

According to some embodiments of the present disclosure, the composition can further include a first material and a second material surrounded by the first material.

According to some embodiments of the present disclosure, the second material can be sodium niobate (NaNbO$_3$).

According to some embodiments of the present disclosure, the second material can be present in an amount of 3 to 7 mol % of the total piezoelectric composition.

According to some embodiments of the present disclosure, the second material can be added by 3 to 7 mol % for the composition of the piezoelectric material of Chemical Formula 1.

According to some embodiments of the present disclosure, the first material can be adjusted by the content of the second material added in the Chemical Formula 1.

According to some embodiments of the present disclosure, the first material can include a plurality of grains that are crystal-oriented in a single direction, the second material is disposed inside the plurality of grains, and the plurality of grains can be grown in response to the second material.

A method for fabricating a composition of a piezoelectric material according to an embodiment of the present disclosure includes weighing a base material and a seed material, mixing the base material and the seed material to prepare a slurry, molding the slurry to prepare a molded body, and sintering the molded body to prepare a sintered body, wherein the weighed base material and the seed material are each independently expressed by Chemical Formula 1.

$(1-y)(Na_aK_{1-a})(Nb_{1-x}Sb_x)-ySrZrO_3+n$ mol % [Chemical Formula 1]

Here, 0.01≤y≤0.10, 0.4≤a≤0.6, 0≤x≤0.06, and 0.5≤n≤1.5.

According to some embodiments of the present disclosure, x can range from 0.04 to 0.055.

According to some embodiments of the present disclosure, the seed material can be sodium niobate (NaNbO$_3$) single crystal.

According to some embodiments of the present disclosure, the seed material can be added in an amount of 3 to 7 mol % of the total piezoelectric composition.

According to some embodiments of the present disclosure, the preparing of the sintered body can include a first sintering step performed at a first temperature and a second sintering step performed at a second temperature, wherein the first temperature is 1160° C., the second temperature is 1030° C. to 1070° C., the first temperature in the first sintering step is maintained for 0 hour and the second temperature of the second sintering step is maintained for 6 hours. According to some embodiments herein, before the step of weighing the base material and the seed material, the base material can be prepared by a step of weighing the base material and a step of mixing the base material.

According to some embodiments of the present disclosure, before the step of weighing the base material and the seed material, first weighing the seed material is performed and comprises, providing a first seed material, preparing a first seed from the first seed material, combining the first seed and a second seed material, and preparing a second seed from the first seed and the second seed material, thereby preparing the seed material, the first seed material can include bismuth sodium niobate ((Bi$_{0.5}$Na$_{0.5}$)NbO$_3$), and the second seed material can include sodium niobate (NaNbO$_3$).

According to some embodiments of the present disclosure, the preparing of the second seed can further comprise a heat treatment on a mixture of the first seed, sodium carbonate (Na$_2$CO$_3$), and sodium chloride (NaCl) at 975° C. for 6 hours.

A piezoelectric device according to an embodiment of the present disclosure includes a piezoelectric device layer including a first material layer and a second material layer surrounded by the first material layer, a first electrode part disposed on a first surface of the piezoelectric device layer, and a second electrode part disposed on a second surface facing the first surface, wherein the piezoelectric device layer comprises the composition according to Chemical Formula 1.

$(1-y)(Na_aK_{1-a})(Nb_{1-x}Sb_x)-ySrZrO_3+n$ mol % CuO [Chemical Formula 1]

Here, 0.01≤y≤0.10, 0.4≤a≤0.6, 0≤x≤0.06, and 0.5≤n≤1.5.

According to some embodiments of the present disclosure, x can range from 0.04 to 0.055.

According to some embodiments of the present disclosure, the second material layer can be sodium niobate (NaNbO$_3$).

According to some embodiments of the present disclosure, the second material layer can be present in an amount of 3 to 7 mol % of the total piezoelectric composition.

According to some embodiments of the present disclosure the first material layer can be adjusted by the content of the second material added in the Chemical Formula 1.

According to some embodiments of the present disclosure, the second material layer can have a size of 10 to 20 μm.

According to some embodiments of the present disclosure, an aspect ratio of the second material layer can range from 10 to 20.

According to some embodiments of the present disclosure, the first material layer can include a plurality of grains that are crystal-oriented in a single direction, a second material layer is disposed inside the plurality of grains, and the plurality of grains can be grown in response to the second material layer.

A display apparatus according to an embodiment of the present disclosure includes a display panel configured to display an image and a piezoelectric device disposed on a rear surface of the display panel.

According to an embodiment of the present disclosure, since the composition of a piezoelectric material does not include lead and has high piezoelectric properties, the piezoelectric device and display apparatus including the same can be driven by a low driving voltage to have improved piezoelectric properties.

In addition, according to an embodiment of the present disclosure, the method for fabricating a composition of a piezoelectric material can significantly reduce time and cost compared to the method for fabricating a single crystal, thereby significantly improving productivity.

It will be apparent to those skilled in the art that various modifications and variations can be made in the present disclosure without departing from the technical idea or scope of the disclosure. Thus, it is intended that embodiments of the present disclosure cover the modifications and variations of the disclosure provided they come within the scope of the appended claims and their equivalents.

What is claimed is:

1. A composition comprising a piezoelectric material according to Chemical Formula 1:

$(1-y)(Na_aK_{1-a})(Nb_{1-x}Sb_x)-ySrZrO_3+n$ mol % CuO, [Chemical Formula 1]

wherein 0.01≤y≤0.10, 0.4≤a≤0.6, 0≤x≤0.06, and 0.5≤n≤1.5 further comprising:
a first material; and
a second material surrounded by the first material, wherein the second material comprises sodium niobate ($N_aN_bO3$).

2. The composition of claim 1, wherein x ranges from 0.04 to 0.055.

3. The composition of claim 1, wherein the second material is present in an amount of 3 to 7 mol % of the total piezoelectric composition.

4. The composition of claim 1, wherein:
the first material comprises a plurality of grains that are crystal-oriented in a single direction,
the second material is disposed inside the plurality of grains, and
the plurality of grains are grown in response to the second material.

5. A method for fabricating the composition according to claim 1, the method comprising:
weighing a base material and a seed material;
mixing the base material and the seed material to prepare a slurry;
forming the slurry to prepare a molded body; and
sintering the molded body to prepare a sintered body,
wherein the weighed base material and the seed material are each independently expressed by Chemical Formula 1:

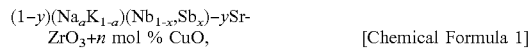

$(1-y)(Na_aK_{1-a})(Nb_{1-x},Sb_x)-ySrZrO_3+n$ mol % CuO,  [Chemical Formula 1]

wherein 0.01≤y≤0.10, 0.4≤a≤0.6, 0≤x≤0.06, and 0.5≤n≤1.5.

6. The method of claim 5, wherein x ranges from 0.04 to 0.055.

7. The method of claim 5, wherein the seed material includes sodium niobate ($NaNbO_3$) single crystal.

8. The method of claim 5, wherein the seed material is added in an amount of 3 to 7 mol % of the total piezoelectric composition.

9. The method of claim 5, wherein the preparing of the sintered body includes:
a first sintering step performed at a first temperature; and
a second sintering step performed at a second temperature,
wherein the first temperature is 1160° C.,
the second temperature is 1030° C. to 1070° C.,
the first temperature in the first sintering step is maintained for 0 hour, and
the second temperature of the second sintering step is maintained for 6 hours.

10. The method of claim 5, wherein, before the step of weighing the base material and the seed material, a preparing step of the seed material is performed and comprises:
providing a first seed material;
preparing a first seed from the first seed material;
combining the first seed and a second seed material; and
preparing a second seed from the first seed and the second seed material, thereby preparing the seed material,
wherein the first seed material includes bismuth sodium niobate (($Bi_{0.5}Na_{0.5}$)$NbO_3$), and the second seed material includes sodium niobate ($NaNbO_3$).

11. The method of claim 10, wherein the preparing of the second seed further comprises performing a heat treatment on a mixture of the first seed, sodium carbonate ($Na_2CO_3$), and sodium chloride (NaCl) at 975° C. for 6 hours.

12. A piezoelectric device, comprising:
a piezoelectric device layer including a first material layer and a second material layer surrounded by the first material layer;
a first electrode part disposed on a first surface of the piezoelectric device layer; and
a second electrode part disposed on a second surface facing the first surface,
wherein the piezoelectric device layer comprises the composition according to claim 1,
wherein the second material layer includes sodium niobate ($N_aN_bO_3$).

13. The piezoelectric device of claim 12, wherein x ranges from 0.04 to 0.055.

14. The piezoelectric device of claim 12, wherein the second material layer is present in an amount of by 3 to 7 mol % of the total piezoelectric composition.

15. The piezoelectric device of claim 12, wherein the second material layer has a size of 10 to 20 μm, or an aspect ratio of the second material layer ranges from 10 to 20.

16. The piezoelectric device of claim 12, wherein the first material layer comprises a plurality of grains that are crystal-oriented in a single direction,
the second material layer is disposed inside the plurality of grains of the first material layer, and
the plurality of grains of the first material layer are grown in response to the second material layer.

17. A display apparatus, comprising:
a display panel configured to display an image; and
the piezoelectric device according to claim 12, and disposed at a rear surface of the display panel.

* * * * *